(12) United States Patent
Knol et al.

(10) Patent No.: US 7,146,595 B2
(45) Date of Patent: Dec. 5, 2006

(54) DATA STRUCTURES FOR REPRESENTING THE LOGICAL AND PHYSICAL INFORMATION OF AN INTEGRATED CIRCUIT

(75) Inventors: David A. Knol, San Jose, CA (US); Salil Ravindra Raje, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 336 days.

(21) Appl. No.: 10/800,042

(22) Filed: Mar. 12, 2004

(65) Prior Publication Data

US 2005/0204315 A1    Sep. 15, 2005

(51) Int. Cl.
*G06F 17/50* (2006.01)

(52) U.S. Cl. .................... 716/11; 716/8; 716/9; 716/10

(58) Field of Classification Search ............... 716/8–11
See application file for complete search history.

(56) References Cited

U.S. PATENT DOCUMENTS

| | | | |
|---|---|---|---|
| 5,140,526 A | | 8/1992 | McDermoth et al. |
| 5,499,191 A | | 3/1996 | Young |
| 5,513,119 A | | 4/1996 | Moore et al. ............... 364/491 |
| 5,617,327 A | | 4/1997 | Duncan |
| 5,648,913 A | * | 7/1997 | Bennett et al. ................. 716/6 |
| 5,659,484 A | * | 8/1997 | Bennett et al. ............... 716/16 |
| 5,991,523 A | * | 11/1999 | Williams et al. ............... 716/18 |
| 6,170,080 B1 | | 1/2001 | Ginetti et al. ................. 716/18 |
| 6,223,329 B1 | * | 4/2001 | Ling et al. ...................... 716/7 |
| 6,408,422 B1 | | 6/2002 | Hwang .......................... 716/3 |
| 6,631,508 B1 | | 10/2003 | Williams |
| 2004/0078767 A1 | | 4/2004 | Burks et al. |

OTHER PUBLICATIONS

U.S. Appl. No. 10/792,164, filed Mar. 3, 2004 Knol et al.
Wang, Maogang, et al., "Multi-Million Gate FPGA Physical Design Challenges," ICCAD '03, Nov. 11-13, 2003, pp. 891-898, Available from ICCAD, San Jose, California, USA.

* cited by examiner

*Primary Examiner*—Vuthe Siek
*Assistant Examiner*—Naum B. Levin
(74) *Attorney, Agent, or Firm*—Ronald C. Fish; LeRoy D. Maunu

(57) ABSTRACT

A floor planner tool for integrated circuit design which provides tools and displays for a designer to create a floor plan to define desired placement of circuits defined in a logical netlist by creating a physical hierarchy comprised of nested pblocks. Each pblock is a data structure which contains data which defines which circuits from the logical netlist are assigned to it. Each pblock stands alone and can be input to a place and route tool without the rest of the physical hierarchy. Each pblock data structure contains pointers to the circuits on the netlist assigned to that plbock, identifies other pblocks nested within it and contains at least a list of boundary pins for that pblock. Net data structures in the physical hierarchy define which nets are connected to which pins. PCellview data structures define the internal structure of each pblock.

6 Claims, 14 Drawing Sheets

PROCESS TO CREATE A NEW FLOORPLAN USING IMPROVED FLOOR PLANNER

PNETWORK UPDATE PROCESS

For each instance which has been removed from a pblock, and each pin of said instance, disconnect the net from the pin and clean up the physical nets/pins as appropriate in the data structure — 66

For each instance that has been added to a pblock, and each pin of the added instance, connect pin and create physical nets/pins as is appropriate — 68

FIG. 6

PROCESS TO DISCONNECT AND RECONNECT AN ENTIRE PBLOCK WHEN
IT IS MOVED OUT OF ONE PARENT PBLOCK AND INTO ANOTHER

DATA STRUCTURES FOR REPRESENTING THE LOGICAL AND PHYSICAL INFORMATION OF AN INTEGRATED CIRCUIT

FIELD OF USE AND BACKGROUND OF THE INVENTION

This patent application is related to the technology disclosed in a prior U.S. patent application entitled SYSTEM FOR REPRESENTING THE LOGICAL AND PHYSICAL INFORMATION OF AN INTEGRATED CIRCUIT filed on Mar. 3, 2004, Ser. No. 10/792,164.

Field programmable gate arrays (FPGAs) and application specific integrated circuits are increasingly popular types of integrated circuits. However, increasingly complex integrated circuits in general are increasing in popularity because integration of large systems on a chip substantially reduces manufacturing costs over other classic forms of construction of circuits.

When designing integrated circuits, the final design is reduced to a file called a netlist. A netlist is a description of the devices that are to be fabricated on an integrated circuit and the connections between each terminal of each device to form the circuit.

Layouts of integrated circuits are typically done on workstations which have a fixed amount of random access memory (RAM). In complex integrated circuits, the netlist can be so large that it cannot all be stored in the RAM available on the workstation. This results in part of the netlist being stored on the hard disk of the workstation and being paged in and out of RAM. This slows down the workstation and can be frustrating for the designer.

In laying out integrated circuits, it is important to keep devices that have to communicate data or signals with each other close to each other in the layout. Long lines of conductive material running across the chip between terminals of devices that need to communicate signals cause excessive amounts of parasitic capacitance. Parasitic capacitance slows down the operation of integrated circuits and limits the upper frequency of the clock speed that controls all switching on the chip. Keeping devices that need to communicate signals to each other close together optimizes a design for speed.

Designs of integrated circuits are implemented in terms of logical blocks, each of which performs a specific type function. Designers also want to group logical blocks that are connected together by many wires close to each other to minimize routing congestion. If two logical blocks that are highly interconnected are far apart on the chip, the expanse of chip area between the two logical blocks will have many wires running across it. This makes this space less useable because it is more difficult to integrate other circuitry in this space and get connections to it without interference with the other lines running across the space.

Netlists are expressed in pure logical terms of a hierarchy of logical blocks and how they are interconnected. The hierarchy is comprised of higher level logical blocks which are comprised of lower level logic blocks each of which is itself comprised of lower level logical blocks, and so on to the leaf nodes of the hierarchical tree. Logical blocks are such things as adders, an Arithmetic Logic Unit (ALU), system memory cache, system bus, display driver circuitry, etc. An example of a hierarchy might be a top level logical block which is a microprocessor and which has four ALUs. Each of these ALUs is comprised of four adders for this example. Each of these adders has two NAND gates and an OR gate for this example. These logical blocks represent a three level hierarchy, and the connections between these circuits define a logical netlist with a three level hierarchy.

The netlist is purely logical and relates what the different logical blocks are, how they are interconnected, and the hierarchy between the various logical blocks. There is no information in a logical netlist which indicates where on an integrated circuit any particular device such as a transistor, adder, etc. which is part of a logical block should be placed.

To actually physically lay out the circuit, the netlist is input to another tool running on a workstation called a floor planner. The floor planner lets the designer layout the general floor plan of the chip by allowing the designer to specify the locations on the chip for the high level logical blocks in the hierarchy. For example, "the arithmetic logic unit goes here", and the "RAM cache goes there" and "the system bus circuitry goes there", etc. The floor planner then outputs the netlist and a set of directives which are usually a separate file. The directives and netlist are then input to another tool called a placement and router tool which functions to specifically identify the location on the chip where every transistor and every other device goes and how the connections between devices will be routed.

Prior art floor planner tools did allow the designer to lay out the floor plan of the chip but only using logical blocks defined in the netlist. This was not optimal because it might result in placement of circuits that need to communicate with each other which are in different logical blocks far from each other on the chip.

Therefore, a need has arisen for a new floor planner tool which allows a chip floorplan to be generated which is laid out with performance issues in mind. To do its work, a floor planner tool according to the invention would have to be able to store the logical netlist in memory and then must generate another representation of the logical netlist that defines physical blocks in the floor plan layout and which logical blocks are in each physical block. Specifically, the floor planner tool needed would have to be able to generate a physical block hierarchy to define the physical layout of the chip without regard to the logical block boundaries defined by the logical netlist. The physical block hierarchy is all about performance as it allows the designer to place circuits that need to communicate with each other close together on the chip. The needed floor planner tool would then be able to provide the physical constraints and directives to the place and route tool based upon the physical block hierarchy.

The physical block hierarchy will contain a great deal of data, though usually not as much as the logical netlist. Still, any data at all for the physical hierarchy in addition to the large logical netlist aggravates the memory shortage problem for the place and route tool on complex designs. Large netlists and large physical directives files complicates and slows down the operations of all both the floor planner tool and the place and route tool if the size of the netlist and physical directive file exceeds the available RAM capacity. Frequently, place and route tools cannot handle all the gates in a large netlist even if they have 4 gigabytes of RAM. If the place and route tool or the floor planner tool cannot have all of the netlist in RAM, it will not operate unless virtual memory is turned on and part of the netlist on the workstation hard disk. Putting part of the netlist on hard disk and paging it in and out of RAM has not proved to be a desirable solution as it is very slow.

Therefore, a need has arisen for a floor planner tool which can generate a physical block hierarchy with a compact data structure. This physical block hierarchy must be generated from a netlist and maintain the functionality and connectivity defined in the netlist. Such a floor planner tool would allow a user to place physical restraints on the placement of certain logical blocks and provide as an output both a logical netlist as well as a physical block list which is compact in data structure. In particular, a need has arisen for a floor planner tool which generates a compact data representation of the physical blocks in the floor plan layout without repeating the entire content of the logical netlist by referencing the logical netlist. This enables the data required to do floor planning and generate output physical directives to all reside in RAM of the floor planner tool thereby speeding its operation.

Big logical netlists and compact representations of a physical layout still create problems for place and route tools though because this data can still exceed the capacity of the RAM of the workstation upon which the place and route tool is executing. Exceeding the RAM capacity frequency happens because the place and route tool uses the RAM as scratchpad memory to record trial placements while it is going through its placement and routing algorithms. This data can expand the data consumed by the netlist by a factor of three until a final place and route solution is reached by the tool whereupon the amount of data that needs to be stored shrinks back down. In other words, while the place and route tool is thinking, it generates large amounts of trial and error placement and routing data on proposed placements that must be stored. Once a solution is reached, the data on the proposed placements that were not adopted can be discarded. However, if the place and route tool runs out of RAM during this process, complications will arise.

Accordingly, a need has also arisen for a floor planner tool which can break the logical netlist and physical directives list up into stand alone segments each of which defines some portion of the overall chip design and which is much smaller than the overall netlist. In effect, the output of this tool would define a subchip within an overall chip layout. The subchip would usually have terminals which need to be connected to other terminals of other logical blocks and it would usually have timing constraints which must be met so that the overall chip will be able to meet its timing constraints. Such a floor planning tool would therefore provide pinout positions on the subchip as well as positions for all logical blocks within the one or more physical blocks of the subchip and it would provide timing constraints or a timing budget the subchip must meet. Each of these netlist segments would define a subchip which could be input to the place and route tool independently of the other segments. Each netlist segment would be small enough to entirely fit in RAM of the place and route tool. Because of the smaller size of the subchip netlist, the growth in data volume during the place and route algorithm would be unlikely to exceed the RAM capacity of the place and route workstation.

This divide and conquer approach has been known in the ASIC world, but no such floor planner tool exists yet the FPGA world.

It is possible to not use a floor planner in the above described process and just input the netlist to the place and route tool. Place and route tools are not very deterministic though. Thus, the results in terms of clock speed can vary wildly from one run of a place and route tool to the next with exactly the same netlist as the input. Thus, one run of the place and route tool can result in the final design have a clock speed of 130 Mhz, and the next run with exactly the same netlist having been input can result in a clock speed of 80 Mhz.

The inclusion of a floor planner in the process greatly improves the stability of the performance of the final design because it allows the designer with knowledge of the operation of the circuit to specify which logical blocks or groups of logical blocks need to be placed close to each other. This information then is reduced to directives which restrict the placement of individual transistors and other components by the place and route tool so that the final performance of the chip will be more predictable.

The place and route tool output can then be used as the input to a bitstream tool which sets the various switches in a field programmable gate array into appropriate on and off conditions to implement the functionality defined by the netlist. In the case of an application specific integrated circuit, the output of the place and route tool can be used to generate an appropriate mask set to define the functionality of the ASIC in accordance with the netlist.

Prior art floor planner tools were restricted to working with the logical blocks defined in the logical netlist. However, the floor planning process works better if the designer is allowed to create physical blocks which define a physical block hierarchy and then layout the floor plan with these physical blocks. Each of these physical blocks incorporates the circuitry of one or more logical blocks. If one floor plans with only the logical blocks defined by the netlist, it is often not possible to get the best performance. This is because some circuits in one logical block may be highly interconnected with a need to communicate with circuitry in another logical block. Performance issues would require that these two different circuits be placed close to each other on the chip. But if the floor planner is restricted to placement of logical blocks, it is possible that the two circuits in different logical blocks that need to communicate will not be placed close enough together on the chip to achieve optimum performance.

Further, chip designers like to evaluate a plurality of scenarios for a chip floor plan. In prior art floor planners, each different floor plan scenario required reading the entire logical netlist into RAM, and only one floor plan could be generated from each copy of the netlist. To do two floorplans would require two copies of the netlist. This aggravates the memory shortage problem Therefore, a need has arisen for a floor planning tool which can invade the logical block boundaries to create physical blocks arranged in a hierarchy and each of which can span logical block boundaries while maintaining the connectivity expressed in the logical blocks of the netlist. A need has also arisen for a floor planning tool which can have multiple floor plan scenarios simultaneously while storing only one copy of the logical netlist in memory and simultaneously expressing the physical block hierarchy by reference to the logical netlist thereby keeping the data representation of the physical block hierarchy compact.

SUMMARY OF THE INVENTION

The teachings of the invention contemplate data structures, computer processes, programmed computers and computer readable media which contain instructions to control a computer to provide a new floor planning tool. These inventions implement a floor planning tool which allows users to creates new physical hierarchies to place circuits (instances) from a logical netlist (which contains no physical placement information) onto a floorplan of any integrated circuit and allows any instance from the logical netlist to be put into any physical block of a floorplan. This allows the user to give guidance to a place and route tool on where specific circuits are to be placed in the final chip layout so as to enhance performance and ensure that timing and power consumptions constraints can be met. This floor planning tool is useful in laying out conventional integrated circuits, FPGAs, ASICs, structured ASICs and any other type of integrated circuit.

The physical blocks define a physical hierarchy, and the computer processes allow invasion of the logical blocks of the netlist to get information needed to define the instances that have been assigned to various pblocks. Extensive use of pointers in the data structures of the physical hierarchy are used to save storage space needed to store the data structures of the physical hierarchy. These pointers point to data in data structures of the logical hierarchy so that this data does not have to be repeated in the data structures of the physical hierarchy.

The teachings of the invention include a data structure stored on a computer readable medium for physical blocks (hereafter pblock) which can be nested to define a pblock hierarchy. The teachings of the invention also contemplate data structures for physical nets, and a data structure for each physical cellview owned by a particular pblock.

The computer readable medium can be anything which can be read by a computer including CD-ROM, floppy disk, hard disk, DVD-R media, random access memory, flash memory, magnetic tape, punch cards, etc.

Each pblock has its own data object which defines the location of the pblock on the floor plan of the integrated circuit (chip) being designed. The floorplan provides the proposed placement of the circuits to be integrated on said chip. Each pblock data object also includes a list of child pblocks, said child pblocks being pblocks which are contained within the parent pblock. Each pblock data object includes a list of instances or circuits that are assigned to the pblock. Each instance entry on the list is implemented through use of a pointer to the data object which defines the instance in the original logical netlist thereby reducing the amount of data that needs to be stored for the physical hierarchy.

There is also a data structure which defines the floorplan being designed in terms of a single array which links every instance which has been assigned to a pblock to that pblock. The floorplan data structure includes a field which identifies a root pblock which is a pblock which will contain all other pblocks in the hierarchy (it is at the top of the hierarchical tree) and therefore will contain all instances assigned to the pblocks in the hierarchy.

Use of pblocks and a physical hierarchy to define the positions of circuits on chip floorplans greatly improves the performance of the chip because the logical netlist includes no position information. This leaves it up to the place and route tool to put circuits on the chip surface wherever it determines they need to be. This can result in some circuits being placed too far away from each other to meet timing constraints or power consumption constraints. By allowing the designer to place pblocks on a chip floorplan and then populate them with circuits from the logical netlist, a designer can place circuits that have hard to meet timing and power constraints close to each other in the final design. This decreases the amount of parasitic capacitance (parasitic capacitance is proportional to length) in the conductive lines between the chips and reduces the propagation delays and power consumption on these shorter lines.

The teachings of the invention also include a process a computer executes to create the physical hierarchy and a computer programmed to carry out this process and a computer readable medium of expression which stores instructions to control a computer to carry out the process. The overall process carried out by a computer to create a physical hierarchy is generally comprised of the following steps:

A) storing the data structures of a logical netlist;
B) displaying on one portion of a computer display a representation of the instances defined by said logical netlist;
C) providing one or more tools a user can invoke to create and locate on a floorplan of an integrated circuit being designed and comprising one or more pblocks and responding to the use of said tools to create one or more said pblock(s) by creating data objects representing said pblocks, said floorplan being displayed on the same computer display as said representation of said instances defined by said logical netlist, and wherein pblocks can contain other pblocks so as to establish a physical hierarchy;
D) providing one or more tools a user can invoke to assign instances from said displayed representation of instances defined by said logical netlist into pblocks in said displayed hierarchy of pblocks;
E) responding to such assignment operations by changing the data in said data objects representing said pblocks to reflect which instances are assigned to each pblock; and
F) further responding to such assignment operations by determining the original connectivity between instances defined in said logical netlist and automatically changing data in predetermined data objects of said physical hierarchy so as to recreate said original connectivity by creating new nets and new pins as necessary which recreate said original connectivity.

Step E is the process carried out by the PTree Update process described in the Detailed Description portion of the invention. This process is responsible for updating the data objects that define the physical hierarchy when an instance (referred to in the following steps as instToAppend) is moved from one pblock to another. It is comprises generally of the following steps:

marking instToAppend entries designating instances from said logical netlist which have been moved to a pblock with a pointer to the pblock to each instance has been moved, said pointer being in an array m_instanceAssignments (hereafter referred to as the array) which defines which instances are assigned to each pblock;

marking all child instances in said logical hierarchy of each said instToAppend in said array to point to the same pblock to which said instToAppend was assigned;

recursing up the logical hierarchy from instToAppend until a rooted parent is found which has been assigned to a pblock (hereafter called rootedPBlock) and mark the rooted parent as zero in said array, where a rooted parent is an instance which is defined by a data object in said physical hierarchy which has a flag set which indicated said rooted parent has been assigned to a pblock and where marking an instance to zero in said array causes said instance to disappear from the physical hierarchy, where disappear from the physical hierarchy means the instance is not assigned to a particular pblock;

unwinding the recursion from said rooted parent along a line of said physical hierarchy toward said instToAppend and mark as zero in said array all ancestor instances in said physical hierarchy between said rooted parent and said instToAppend, where an ancestor instance is any instance in said physical hierarchy on a line of descendants between said rooted parent and said instToAppend not including either said rooted parent nor said instToAppend;

marking all siblings of any ancestor instance in said array as assigned to said rooted pblock if not already so marked by setting a flag in a data structure representing said instance in said physical hierarchy to a "rooted" state and making sure a pointer to said sibling is present in a data structure representing said rooted pblock in said physical hierarchy;

determining if all sibling instances of said instToAppend in said physical hierarchy are marked as belonging to the same pblock as said instToAppend, and, if so, performing a collapse operation to resurrect a parent instance of said siblings in said physical hierarchy by removing or setting to zero entries in said array for all said sibling instances which are components of said parent instance and adding an entry to said array for said parent instance and data indicating said parent instance is assigned to the same pblock as said sibling instances which were component instances of said parent instance.

Generally, what this process comprises is: changing the pointers in the m_instanceAssignments array to reflect the new pblock to which an instance has been assigned; marking all children instances of the instance which was moved as belonging to the same pblock as the parent instance which was moved; searching the physical hierarchy for a rooted parent and marking it in the array as zero so that it disappears and finding all the ancestors of the instance that moved along the line of descendants from the rooted parent to the instance that was moved and marking them as zero; marking all siblings of any ancestor found as belonging to the same pblock the rooted parent was assigned to and determining if all children of a parent are in the same pblock, and, if so, marking them as zero and resurrecting their parent as an entry in the array and marked as assigned to the same pblock as all the children of that parent.

When an instance is moved to a new pblock, all its connections that exist between its pins and other pins have to be disconnected and recreated using boundary pins on the boundaries of pblocks and new nets. This is done by the PNetwork Update process which is the process carried out by step F above. This is done by the following steps:

determining which instances have been moved from one pblock to another;

for each instance that has been removed from a pblock, and for each pin on the removed instance, disconnect the pin from any net to which it is connected and removing any nets not needed in a pblock, said disconnection of pins and removing of nets accomplished by altering data defining said physical hierarchy;

for each instance that has been added to a pblock, and for each pin on the added instance, create one or more new physical nets and pblock boundary pins as needed to connect said pins of all instances which have been moved to a different pblock to the same other pins said pins of said instances which have been moved were originally connected to prior to said move, said creation of new boundary pins and nets accomplished by altering data defining said physical hierarchy.

After the floor planning tool according to the invention completes the new physical hierarchy, it outputs a new netlist based upon the physical hierarchy with directives on placement to the place and route tool.

In general, the genus of the invention is defined by the following characteristics which all species will share:

any data structure and any process which creates said data structure which allows a designer to physically locate wherever the designer desires individual instances or circuits defined by a logical netlist on a floor plan of a chip being designed by assigning individual instances to pblocks in the floorplan;

where the pblocks can contain any instance from the logical hierarchy without regard to the hierarchical structure of the logical netlist; and where the process automatically adjusts the data in the data structure so as to make sure that all instances from the logical netlist have been assigned to a pblock and so as to maintain the original connectivity defined by the logical netlist when instances are moved to pblocks for the first time or are later moved from one pblock to another.

Various Subspecies within this Genus:

1) Use pointers to instances in the logical netlist as the data in the physical hierarchy data structure which defines which instances are in each pblock so as to save memory space needed to store the data of said physical hierarchy. The original logical netlist is kept intact and the physical hierarchy data structure is kept very compact through the liberal use of pointers to data structures in the logical netlist that do not have to be repeated in the physical hierarchy.

2) Another subspecies is to repeat the data from the logical hierarchy in the physical hierarchy.

3) Allow multiple different floor plans to be developed simultaneously by using different sets of pointers to the same logical netlist.

4) Allow instances to be assigned to pblocks by dragging and dropping instances from the logical netlist to the pblocks or dragging an instance from one pblock to another.

5) Another subspecies is to allow assignment of instances to pblocks by giving text commands in a command line interface.

6) Another subspecies is to make each pblock stand alone in the sense that all nets into or out of the pblock terminate on a pblock boundary pin, and each pblock has its own timing and power constraints for its nets. In this way, large netlists do not have to be stored in their entirety in the RAM of the place and route workstation. Instead, individual pblocks can be output from the floor planning tool to the place and route tool as if each individual pblock was its own stand alone chip. This allows place and route tools to work with large netlists using the directives output by the floor planner tool without exceeding the RAM capacity of the machine.

The ability to define pblocks to put instances together that are in different logical units in the netlist saves having to rewrite the netlist when a designer decides that two circuits in different logical units on the netlist need to be placed together by the place and route tool for performance reasons. Rewriting the netlist is a major problem because timing constraints may have been defined in terms of the original netlist and changing the logical hierarchy would invalidate all the existing constraints.

BRIEF DESCRIPTION OF THE DRAWINGS

FIG. 5 also illustrates the drag and drop operation to create a physical hierarchy and the operation of the PTree routine to guarantee no circuit is left behind.

FIG. 6 is a flowchart of the PNetwork Update process.

DETAILED DESCRIPTION OF THE PREFERRED AND ALTERNATIVE EMBODIMENTS

Definitions

Figure 1:
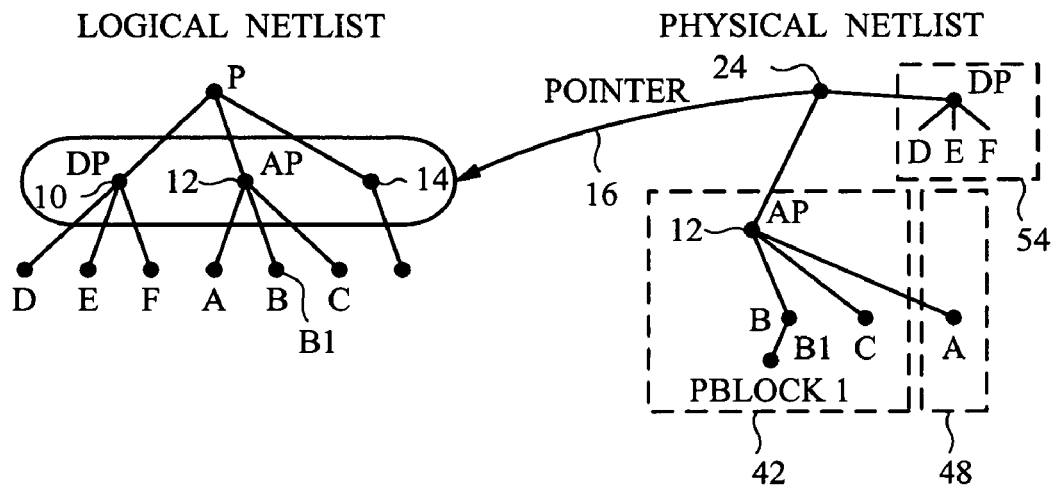
FIG. 1 is a symbolic diagram of a typical logical hierarchy that defines a chip.

The teachings of the invention contemplate a general purpose computer coupled to a display, a keyboard and a pointing device and programmed with an operating system which executes as an application the floor planning software to be described below. The computer typically has a hard disk, and one or more ports for inputting and outputting data and may have a CD-ROM drive, floppy disk drive, DVD-RAM drive etc. to read in data stored on portable media.

To best understand the descriptions herein, consider the following terminology definitions.

Instance—a piece or block of logic. It can be 'flat' (aka primitive), e.g., something simple and indivisible like an 'AND' or 'NOT'. It can also be hierarchical—e.g., something that is defined by and includes at a lower level in a hierarchy, individual instance of simpler circuits such as a set of flat instances to form a more complex block of logic, such as an ALU or large RAM.

Pin—represents an input or output node for piece of logic, I.e., an instance, either primitive or hierarchical. Every instance has a list of pins that represent all inputs and outputs for that block of logic.

Net—represents a connection between a set of pins on various instances. Nets define how instances interact with each other—one instance's output pin may serve as input to a pin on several other instances (a fanout).

Cellview—the "guts" or internals that define an instance or block of logic. Primitive instances have a "black box" cellview, I.e., no contents, since by definition they are not hierarchical.

Hierarchy is a convenience that allows users to work at higher levels of abstraction. What really defines how a circuit behaves is the connectivity of all the primitive instances in a design. This means that two circuits with the exact same primitive instances and flat connectivity will have the exact same behavior, regardless of how their hierarchy was built up. A logical hierarchy usually reflects the thought processes of the logic designer, but a different physical hierarchy might better reflect the realities of actual physical implementation on the chip, such as by putting logic blocks or circuits which must communicate frequently close together on the integrated circuit (hereafter chip). Another aspect of physical implementations of chips is that there are timing and power constraints which must be met. These can frequently be met only by keeping circuits that need to send signals between themselves close together on the chip. This is because the amount of parasitic capacitive loading on the nets coupling the circuits will slow down the signal propagation too much (and consume unnecessary power) to meet timing constraints if the nets are physically too long. Parasitic capacitance of a net is proportional to its length. Conductive paths on a chips are sometimes herein also referred to as wires although each wire is not really not so much a wire as a deposit of conductive material along a layer of a chip.

The goal of the physical hierarchy created using the teachings of the invention is therefore to allow the user to read in a design with its original logical hierarchy and see it the tool according to the teachings of the invention with the physical hierarchy so that floor planning to keep certain nets short, etc. Can be performed to improve the performance of the chip and meet its timing and power constraints. However, as the floor planning process progresses, the tool according to the invention also provides means for the development of a completely new physical hierarchy. A tool according to the invention does not alter the original logical hierarchy. A tool according to the teachings of the invention can read in constraints and other supplementary data files that have been written for the original logical hierarchy. A tool according to the invention also preserves in the physical hierarchy the flat connectivity of all the primitive instances defined in the logical hierarchy.

pblock (Physical Block) forms the backbone of the physical hierarchy. It behaves very much like a hierarchical logical instance in that it can and typically does contain other instances—both logical and other pblocks. Here is a simple definition for the class of pblock data objects:

```
class PBlock {
    List<Pins> m_pins              // list of pblock boundary pins
    Rectangle m_optionalRectangle; //size and location on the floorplan
of the pblock
    PCellview* m_parentCellview;    // a pointer to the parent
                                    cellview
    PCellview m_internals;          // Pcellview owned by pblock
defining functionality of pblock via lists of pins, nets, child pblocks and
child instances within the pblock, each list comprised of pointers to data
structures defining said pins, nets, child plbock and child instances, some
of said data structures being part of the original logical
netlist
};
```

Class PBlock has a pointer to the parent cellview which is the cellview of the parent pblock (which encloses the pblock). It also has a list of pins (List<Pins> m_pins) which represent the pblock boundary pins for the pblock created by the PNetwork Update process. These boundary pins are created for the purpose of maintaining a complete and legal physical hierarchy which maintains the same functionality and connectivity defined in the original logical netlist or logical hierarchy. How the same connectivity and functionality is maintained is described below.

There are two distinct types of pins. Both behave much the same way in that a pin can connect to a single net which is why they can be represented as a single class. However, one type of pin lives on the outside boundary of the instance and hence connects to a net external to the instance. This is sometimes referred to as InsTerm in the industry. The other type of pin lives on the inside boundary of the cellview and hence connects to a net internal to that cellview. This is sometimes referred to as a Terminal in the industry. For the sake of the data structures here, the pins are illustrated as one class that will either have a pointer to its instance (in the case of an InstTerm) or a pointer to its cellview (in the case of a Terminal).

The pins of the instances which have been dragged into the pblock are listed in the data objects for each instance in the preferred embodiment. In alternative embodiments, the list of pins in the pblock data object includes both the boundary pins and the internal pins. References in the description below that refer to pins listed in the pblock data object are to be understood as referring to either type embodiment.

The notation PCellview* m_parentCellview represents a pointer to the parent cellview which contains the pblock represented by the data object. This pointer is used to allow the software to regress up the physical hierarchy tree where necessary to do recursive functions defined below. Similar pointers in the pin, net and instances data objects allow the software to recurse up the logical hierarchy for recursive functions defined below. This is the preferred embodiment, but other embodiments may delete this pointer and regress using any other means available. A PBlock data object owns a pcellview (PCellview m_internals). That pcellview owns lists of pins, nets, child pblocks and child instances. Therefore, when the software needs to access any of that information, it goes to the cellview owned by the pblock as listed in the pblock data object and reads the required data.

The notation Rectangle m_optionalRectangle defines the coordinates of two opposite corners of a rectangle representing the pblock and displayed on the floorplan. It therefore defines both the size and the position of the pblock.

The notation PCellview m_internals is the physical hierarchy cellview that represents the internals of the pblock, including any logical instances or other pblocks that have been assigned to it. A pcellview is defined as follows:

```
class PCellview {
    PBlock *m_parentPBlock;
    List<Pin> m_pins;       // connect to internal nets
    List<Net> m_nets;       // internal nets that connect to boundary pins
of pblock and/or internal pins
    List<PBlock> m_childPBlocks;    // internal (child) pblocks
    List<Instance*> m_childInstances;    // internal (child) instances
};
```

In the PCellview data object definition, the notation List<PBlock> m_childPBlocks; within any data object representing a particular pblock defines a list of pblocks named m_childPBlocks which are pblocks which are included (nested) within the pblock defined by the data object. Likewise, the notation List<Instance*> m_childInstances within any data object representing a particular pblock defines a list named m_childInstances which contains pointers to the instances on the original logical netlist of the instances (circuits) which have been assigned to the pblock represented by the data object. The List<Pin> m_pins notation and the notation List<Net> m_nets represent the boundary pins and physical nets, respectively, created by the PNetwork Update process. Specifically, this is a list of internal nets that connect to boundary pins and/or internal pins All external nets that couple to pblock boundary pins can be found in the parent cellview. If a pblock is encompassed by the root pblock, all external nets coupled to the boundary pins of the pblock will be listed in the nets list of the cellview of the rootpblock. But if the pblock is nested within another pblock other than the root pblock, the external nets would be in the nets list of the parent cellview. The notation PBlock *m_parentPBlock represents a pointer to the parent pblock that envelopes the PCellview data object.

Figure 15:
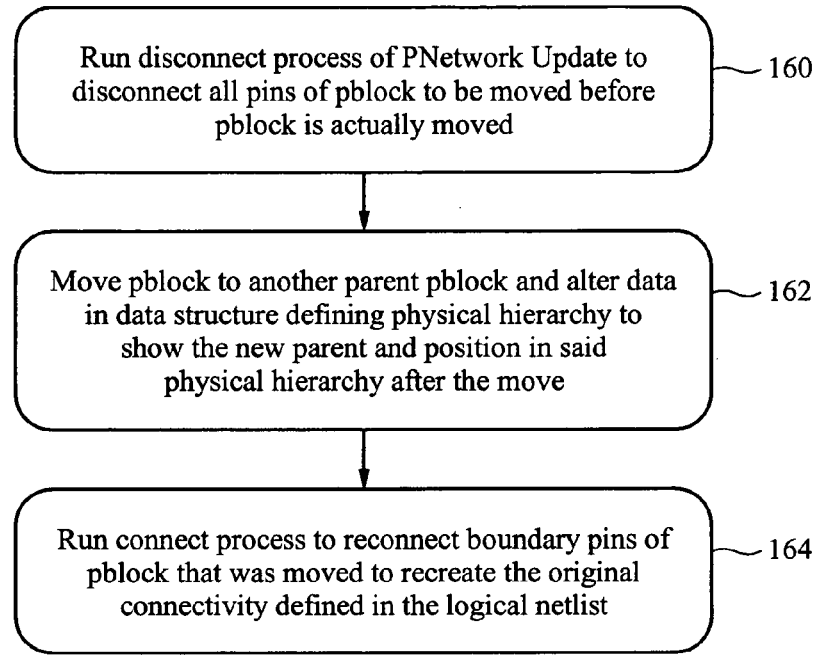
FIG. 15 is a flowchart that shows the processing to disconnect and reconnect a pblock which has been dragged out of one parent pblock and into another parent pblock.

After a pblock has been located on the floor plan and filled with instances, it can be dragged to another location on the floorplan. When a pblock is simply dragged to another location in whatever parent pblock it is in, there is no need to disconnect the nets connecting the pblock to other pblocks and recreate these nets. However, when a pblock which has instances assigned to it is dragged into another parent pblock, the nets connecting the pblock to other parts of the design must be disconnected and recreated. FIG. 15 is a flowchart that shows the processing to disconnect and reconnect a pblock which has been dragged out of one parent pblock and into another parent pblock. FIG. 15 is discussed further below.

Other data structures in the physical hierarchy of interest are as follows. In the following data structure definitions, * denotes "a pointer to a" meaning it is referenced by a given class but owned by another class (such as a class in the logical hierarchy, and // denotes an inline comment which is not part of the class definition.

```
class Cellview {
    a. Instance *m_parentinstance;
    b. List <Pin> m_pins;    // connect to internal nets
    c. List<Net> m_nets;    // internal nets
    d. List<instance> m_instances;    // internal (child) instances
};
```

The class cellview defines the functionality of an instance and points to the data structure of the parent instance of the cellview in the logical netlist where the data regarding the functionality of the instance is found. The Cellview data structure also defines which pins and nets to which the circuit pointed to by the cellview is connected and list the child instances of the parent instance.

```
class Net {
    Cellview *m_parentCellview;
    List <pin*> m_pins;    // may contain both cellview pins and child
                           //instance pins
};
```

The data structure for class net points to the parentCellview in the logical netlist and lists all the pins to which a net is coupled.

```
class PNet {
Cellview *m_parentPCellview;
List <pin*>m_Ppins;// list of Ppins which are boundary pins of pblocks
List <pin*> m_pins;    // may contain both cellview pins and child
                       //instance pins
```

Figure 9:
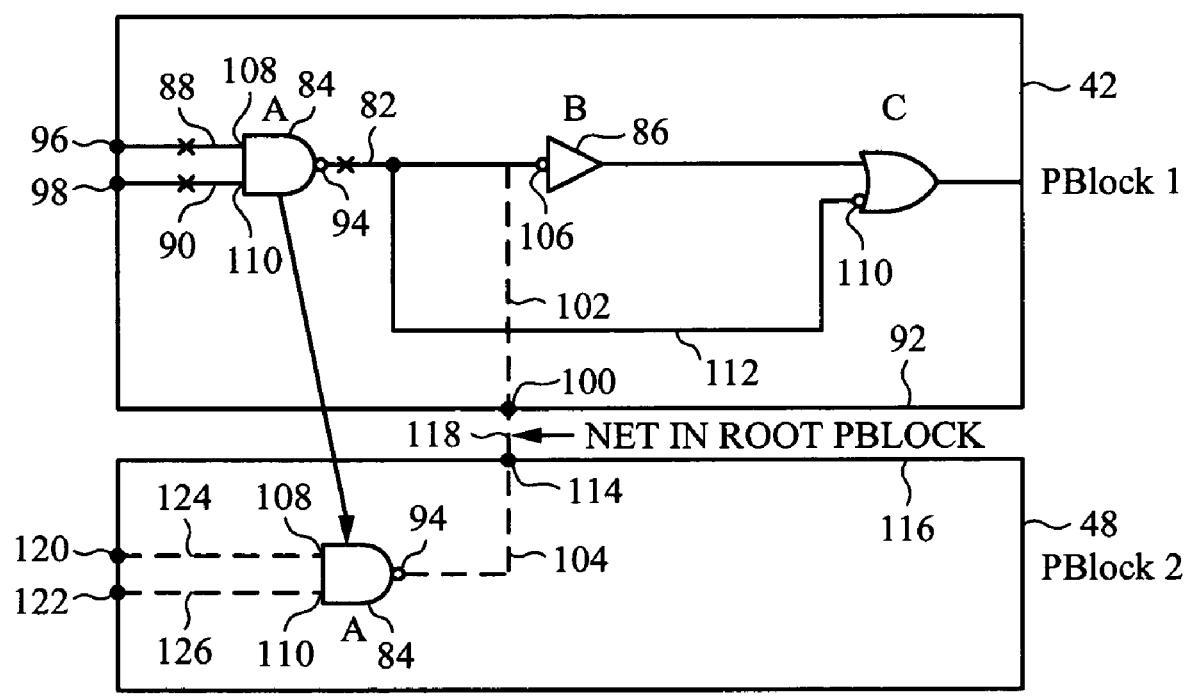
FIG. 9 is a diagram of an example to illustrate the disconnect process and the re-connect and new net synthesis process.

A data structure object in class PNet defines for a particular pnet in the physical hierarchy the boundary pins of particular pblocks to which the pnet is coupled, and the notation Cellview *m_parentPCellview is a pointer to the parent pcellview to which the net belongs. The notation List <pin*> m_pins identifies a list of pins in the logical hierarchy, if any, to which the pnet is coupled. Where a net crosses between two pblocks, it will couple to both logical pins and physical boundary pins on the boundaries of pblocks. An example is shown in FIG. 9. There, the net that couples logical pin 106 in pblock 1 to logical pin 94 in pblock 2 is broken into three pnets. Each pnet will have its own data object in class PNet. The two pin lists in the data object for segment 102 will list logical pin 106 in the list List <pin*> m_pins and will list boundary pin 100 in the Ppin list List <pin*> m_Ppins. The segment 118 will list just boundary Ppins 100 and 114 in the Ppin list and will not list any logical pins. The segment 104 will list Ppin 114 in its Ppin list and will list logical pin 94 in its logical pin list. In some embodiments, the lists of pins will contain pointers to the pin objects for the pins on the list. In other embodiments, the pin lists will contain the data that defines the pins themselves.

```
        class Instance {
            Cellview *m_parentCellview;
            List<Pin> m_pins;      // connect to external nets
            Cellview m_internals;  // functionality of the instance
        };
```

Class instance points to the parentCellview in the logical netlist and lists the pins to which the instance and cellview m_internals defines the functionality of the circuit.

Referring to FIG. 1, there is shown a symbolic diagram of a logical hierarchy for a field programmable gate array or an ASIC. The hierarchy is a three level hierarchy. For the sake of example, assume node 10 represents a system bus, node 12 represents an arithmetic logic unit (ALU) and node 14 represents the control block. To understand how the logical netlist is used to generate a new physical netlist, refer to FIG. 2.

Figure 2:
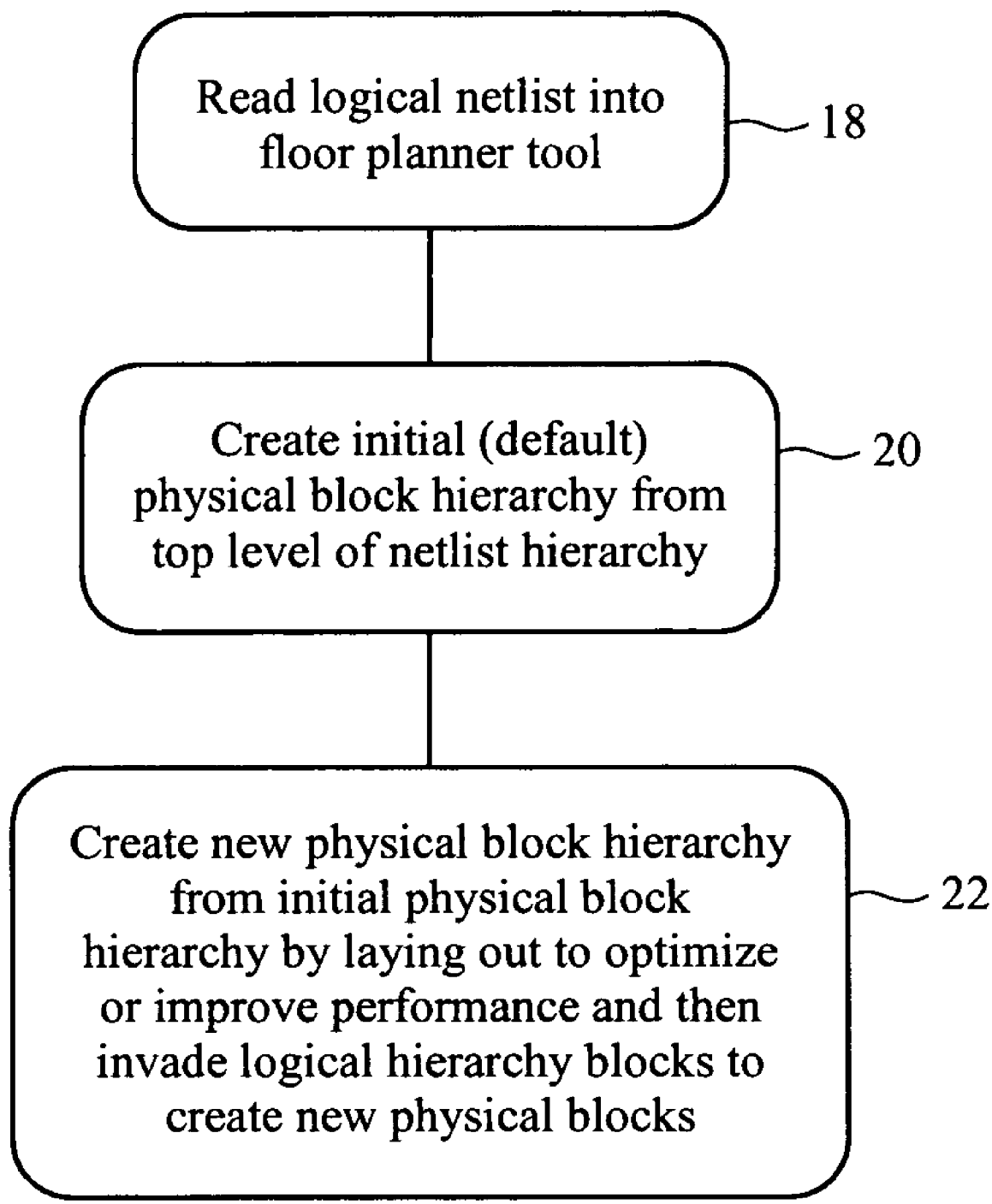
FIG. 2 is a flowchart of a top level method to create a physical block hierarchy from the logical blocks defined on a netlist.

FIG. 2 is a flowchart of the generic process carried out by a floor planner tool according to the teachings of the invention to convert a logical netlist into a physical netlist defining physical blocks which define the same circuit as is defined in the logical netlist.

Step 18 represents the process of reading the original logical netlist prepared by the designer into the floor planner tool according to the invention. In step 20, the floor planner tool makes an initial physical block hierarchy from the top level of the netlist hierarchy. This results in the creation of a root node 24 in FIG. 1 which represents the logical blocks 10, 12 and 14 in FIG. 1. This is done to mimic the operation of prior art floor planner tools, but it can be eliminated in some embodiments and step 18 then transitions directly to step 22.

Significantly, the physical netlist does not replicate in memory all the data that defines the logical blocks 10, 12 and 14 as that would be redundant and use more memory space than is necessary. Instead, each node in the physical netlist is a data structure with a pointer or pointers to the appropriate data in the appropriate logical blocks of the logical hierarchy that define the circuitry that is to be located within that Pblock. In the example of FIG. 1, node 24 of the physical netlist has three pointers, represented by line 16 to the logical blocks 10, 12 and 14. Each of the other instances in the physical hierarchy which is the same circuit as an instance in the logical hierarchy has a pointer in the appropriate data structure of the physical hierarchy to point to the corresponding instance in the logical hierarchy. This allows the overall data structure of the physical hierarchy to be much less voluminous since the data in the data structure of the logical hierarchy which defines instances (circuits) in the physical hierarchy does not have to be repeated in the data objects of the physical hierarchy.

Step 22 is a key step. There, new Pblocks for the physical hierarchy are defined from the initial Pblock hierarchy by laying out the floorplan of the circuit in the way that makes the most physical sense. That is, circuits that need to be close to each other to keep their nets short are put in the same Pblock regardless of whether those circuits are in different logical blocks of the logical netlist hierarchy. This is a major difference and improvement over prior art floor planner tools. Specifically, a floorplanner tool according to the teachings of the invention allows invasion of logical block boundaries to gather up primitives or pieces of logic from different logical blocks that need to be placed close together or clustered on the chip into the same Pblock so that the place and route tool will place these circuits close together in the final layout of the chip. In other words, physical hierarchy supplies the place and route tool with much more definitive guidance regarding placement and clustering of circuits in the final design so as to improve the performance of the final chip layout provided by the place and route tool.

Figure 3:
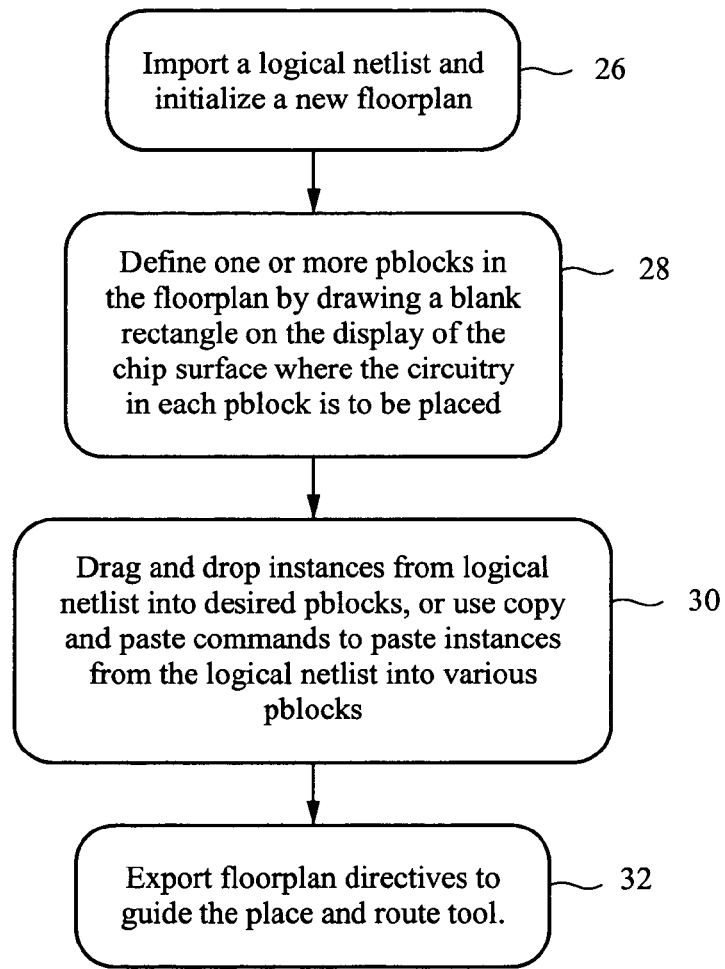
FIG. 3 is a flowchart of a more detailed embodiment of a method to create a floor plan using an improved floor planner tool according to the invention.

FIG. 3 is a flowchart of a process a user follows to create a floorplan with a floor planner tool according to the invention. The steps are:

1. Import a logical netlist and initialize a new floorplan
repeat {
2. Define a new pblock, usually by drawing a rectangle to designate what area on the chip is devoted to circuitry to be included within this pblock.
3. Drag and drop any number of instances from the logical hierarchy browser into the pblock until satisfied with the floorplan 4. Export floorplan directives to guide the place & route tool In step 1, represented by block 26, the user reads a logical netlist defining a chip to be laid out into a workstation upon which the floor planner tool according to the invention is resident. A new floorplan is initialized and this causes the workstation to display a blank area representing the chip surface upon which the circuitry is to be integrated. More than one floorplan can be initialized so that the designer can experiment with multiple chip floorplans. This is discussed further in connection with FIG. 14.

In the preferred embodiment, the logical netlist and the floorplan are displayed in side-by-side relationship on the workstation display to facility the operation of step 3. In the preferred embodiment, the displayed logical netlist has check boxes displayed next to each instance which are checked when the user either assigns the instance to a pblock or when the instance is automatically assigned to a pblock by the operation of the PTree Update process described below. The check boxes give visual feedback to the designer regarding which instances have been assigned to a pblock and which have not.

In some embodiments, the logical netlist is represented by a entry in a logical tree such as is displayed in the left pane of Windows explorer with the detailed instances on the logical netlist displayed in the right window when the logical netlist entry in the left pane is selected. In this embodiment, the operation of dragging and dropping of step 3 is altered so as to use copy and paste commands. A user would select an item from the logical netlist, give the copy command, move to the floor plan display, place the insertion point in the desired block, and give the paste command. In other embodiments, the user can give text commands to create, size and locate pblocks and then to assign particular instances to particular pblocks.

The step of initializing the floorplan is carried out according to the following process and using the following data structure:

```
Initializing the Floorplan
class Floorplan {
// data members
Array<pblock*> m_instanceAssignments; // instance to pblock
pointer lookups
pblock m_rootpblock;
};
```

Each floorplan includes an array (m_instanceAssignments) that contains a reference to a pblock for all logical instances (both hierarchical and primitive) in the design. In other words, the array m_instanceAssignments is an array of pointers which define which logical instances are in each pblock. the array is a cone column table with multiple rows. Each row corresponds to one instance and the row number is referred to as the index. The content of the array at that row number is a pointer to the pblock to which that instance has been assigned. This array can be used to quickly determine which pblock contains any given instance (circuit) on the logical netlist. The floorplan also is initialized by creating a single 'root' pblock for itself—the top of the physical hierarchy—that will contain all other pblocks and logical instances in the physical hierarchy. The array m_instanceAssignments is then initialized to indicate that all logical instances in the design are contained by the root pblock. This is the "starting point" for all new floorplans.

The notation pblock m_rootpblock is an identifier of the root pblock which the floorplan object owns. Because all other pblocks in the physical hierarchy are encompassed within the root pblock, the class floorplan object owns all the pblocks in the physical hierarchy.

Step 2, represented by block 28 in FIG. 3, represents the process of creating a pblock on the floorplan. This is done by drawing a blank rectangle on the floorplan in the area where the circuitry to be included within this pblock is to be located on the chip. This can be done as many times as desired. Each pblock can be included within the root pblock or within another pblock previously created.

Step 3 involves moving instances of circuitry from the logical netlist to the pblock created in step 2. Any pblock can contain any instance of circuitry from any logical block on the logical netlist without concern about logical netlist boundaries. This is a significant difference over the prior art. Prior art floorplanners restricted a designer such that if he or she selected an instance from a logical netlist and put the instance at a particular location on a floorplan, all child instances of the selected instance would be put in the same location on the floorplan and could not be moved to different physical locations. In the invention, when an instance is assigned to a pblock, its children instances will be assigned to the same pblock, but they can be moved at will to other pblocks and the floorplanner tool will automatically update the data structures showing which instances are assigned to which pblocks and will automatically disconnect wires or nets that need to be disconnected to make the move and will automatically re-create the same nets later after an instance is moved to preserve the original connectivity defined in the logical netlist.

Step 3 is performed as many times as necessary until all the instances of circuitry on the logical netlist have been dragged into or pasted into a pblock and the floor plan layout process is complete. There are two processes that are carried out every time an instance of a circuit is dragged from the logical netlist to a pblock. Those processes update the pblock containment (PTree Update) and update the pblock connectivity (PNetwork Update) will be described further below.

Step 4, represented by block 30, represents the process of exporting the floor plan directives regarding physical placement of various circuits to the place and route process.

PTree Update Process

It is necessary to guarantee that all primitives defined in a logical netlist are also contained the pblocks of the physical hierarchy of a floorplan and that the physical hierarchy is kept up to date when instances are moved from one pblock to another. This could be left to the user in some embodiments, but that would be a big headache since big integrated circuits can contain hundreds of thousands or millions of gates, so to leave this responsibility to the user is impractical. Still, it could work and therefore, an embodiment of the invention omits the functionality of the PTree Update Process from the process represented by step 30 in FIG. 3. PTree Update automates the task of updating the physical hierarchy when an instance is moved from one pblock to another and making sure that all circuits from the logical hierarchy have been included in the physical hierarchy in some physical block.

Figure 4A:
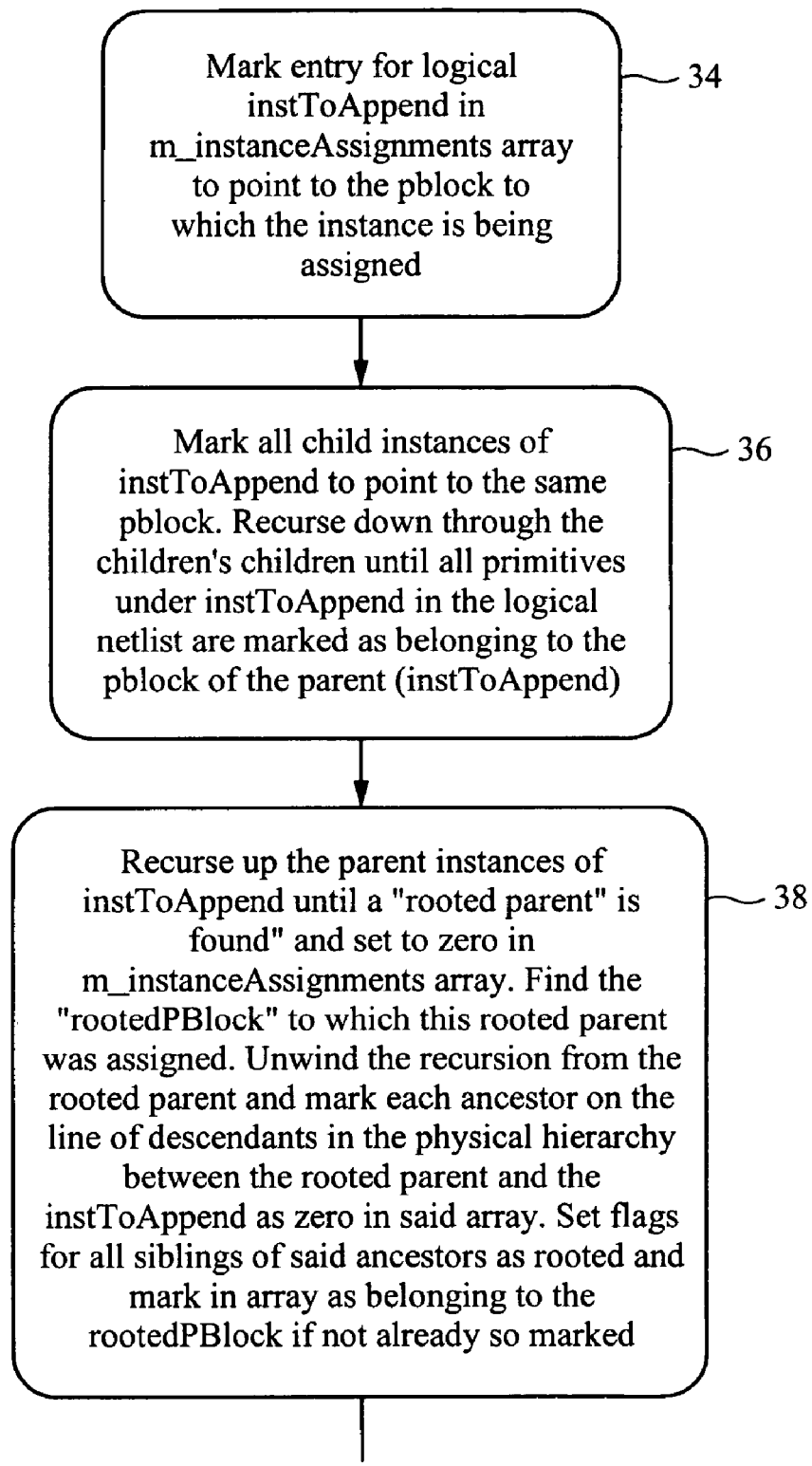
FIG. 4, comprised of FIGS. 4A and 4B, is a flowchart of the PTree update process.
Figure 4B:
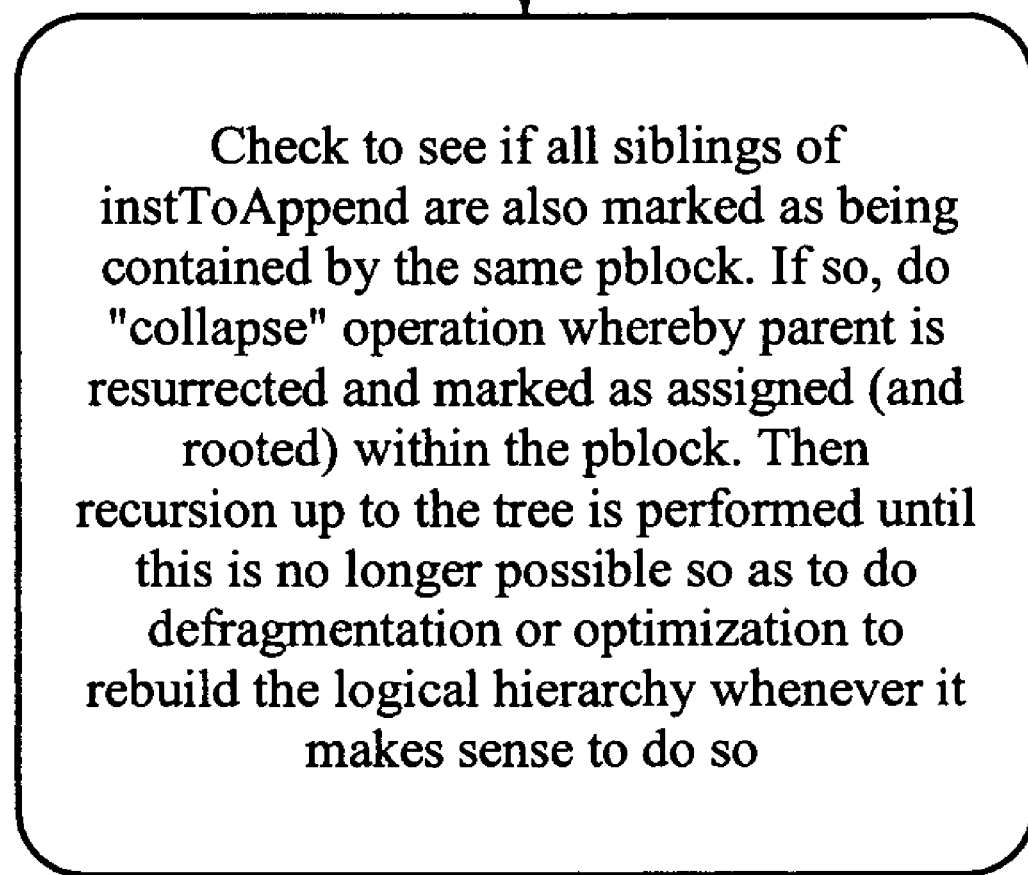

The PTree Update Process goes on continuously in the preferred embodiment, and is comprised of the following steps, as illustrated in the flowchart of FIG. 4 (comprised of FIGS. 4A and 4B):

Mark entry for logical instToAppend in m_instanceAssignments to point to the pblock to which it's being assigned.

Mark all child instances of instToAppend to point to the same pblock. Recurse down through children's children until all primitives underneath instToAppend are marked as belonging to the pblock.

Recurse up the parent instances of instToAppend until a "rooted parent" is found. A "rooted parent" is an instance who's directly assigned to a pblock, I.e., it's parent has been effectively replaced in the physical hierarchy. Let rootedPBlock represent the pblock the "rooted parent" was assigned to. As the recursion unwinds from this rooted parent, mark each parent as 0 and all siblings for that parent as belonging to the rootedPBlock. This step insures that no primitive instance is left behind.

Check to see if all siblings of instToAppend is also contained by the same pblock. If so, execute a "collapse operation", whereby the parent is resurrected and marked as being assigned (and rooted) within the pblock. Recurse up the tree until this is no longer possible. This is a "defragmentation" or "optimization" step, in that it rebuilds logic hierarchy by rejuvenating logical hierarchical instances whenever it makes sense to do so.

Block 34 in FIG. 4 represents step 1 of the PTree update process. This step adds a pointer in the m_instToAppend array that links a particular circuit (called instToAppend) from the logical netlist which has been dragged into a particular pblock to the particular pblock entry in the table.

The process represented by block 36 in FIG. 4 represents step 2 of the PTree update process. In this process, all child instances of instToAppend in the logical hierarchy netlist are marked as included in the same pblock in the m_instToAppend array as the parent instToAppend. This process is repeated for the children's children and their children until all instances in the hierarchy stemming back to the original parent instToAppend are marked as belonging to the pblock as the original parent instToAppend.

Figure 5:
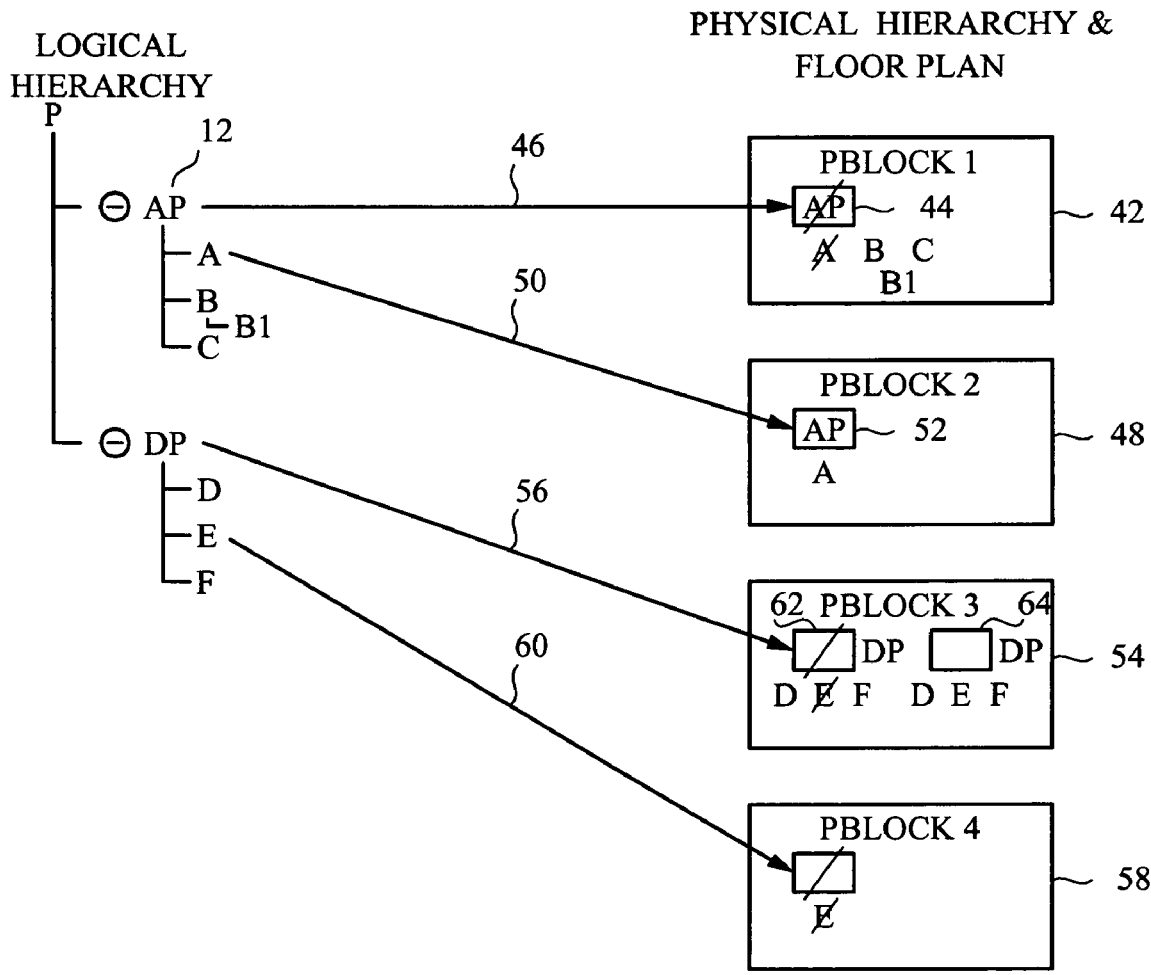
FIG. 5 is symbolic of the types of information in a display on the floor planning tool showing an example logical hierarchy on the left and some sample pblocks on the right for purposes of illustrating operation of the tool.

Suppose, for example, an integrated circuit to be fabricated is defined by a logical hierarchy shown on the left in FIG. 5. Step 36 represents an automated process to, at least temporarily, mark all children of an instance that has been dragged into a pblock as being in the same pblock. For example, suppose instance 12 (called AP) in FIGS. 1 and 5 is dragged into pblock 1, as represented by arrow 46. AP has three children instances A, B and C. What this means is that circuit AP has three component circuits designated A, B and C. When AP is dragged into pblock 1 shown at 42 in FIG. 5, the process of block 36 in FIG. 5 causes children A, B and C of AP to be identified and a child B1 of B to be identified and marked as included in pblock 1 shown at 42. A and C have no children, so no circuit is moved to pblock 1 as a result of looking for children of A and C. This process is continued until all children and children of children and so on of instToAppend have been found and tagged as located in the same pblock as the pblock to which instToAppend has been assigned. This happens every time an instance is dragged to a pblock.

As a form of visual feedback as to what PTree is doing when a designer drags an instance over into a pblock, when these three children A, B and C of AP and grandchild circuit B1 are moved to pblock 1, all these nodes AP, A, B, C and B1 in the display of the logical hierarchy on the left of the display represented by FIG. 5 are highlighted. This highlighting in the left pane tells the designer which instances from the netlist are currently in the pblock selected in the right pane. When the designer selects another pblock in the right pane, the instances in the logical netlist in the left pane which have either been dragged by the designer to that pblock or which have been automatically assigned to that pblock by the PTree process are highlighted in the left pane. If the designer goes back to pblock 1 and selects it, the highlighting in the left pane of all the instances in pblock 1 reappears.

Another part of this visual feedback as to the drag and drop process and the background PTree process is what happens in the display of the pblock to which some instance has been dragged. In the example of instToAppend being instance AP, the display of the rectangle representing pblock 1 on the right side of the display is altered in the preferred embodiment by the addition of a rectangle 44 representing instance AP. The addition of this rectangle 44 adds visual feedback to the designer that the drag and drop process worked and instance AP has had pointer to pblock 1 added to the array m_instanceAssignments in the entry for instToAppend.

The illustration in pblock 1 of instance AP's children A, B and C (and grandchild B1 whose parent is B) is not an actual display in the floor planning tool according to the invention. These notations are only presented in the drawing to symbolize the fact that these instances are automatically marked in the array m_instanceAssignments as being in pblock 1 by operation of the PTree process, but no actual visual display of that fact is given in the display of the physical hierarchy. In the tool according to the invention, if the user were to zoom in on block 44, he would see only the name of instance AP and not all the children and grandchildren names. This is because the names are pretty much meaningless at lower levels of the logical hierarchy because they have been generated by a synthesis tool as the designer makes the design and defines it using a high level language such as HDL. So in some embodiments, displays of blocks with the names for every instance in a physical block may be used, but such displays are not used in the preferred embodiment to avoid unnecessary clutter and the appearance of a large number of rectangles and meaningless names in the floorplan display. In the preferred embodiment, only a display of a rectangle with the name of an instance which has actually been dragged over to the pblock is used.

The automatic assignment of instances to pblocks is only by default and the user can reassign instances to different pblocks if necessary. To do this, the user just selects an instance from the logical hierarchy which is assigned to another pblock and drags it over to the desired pblock. Suppose, for example, the designer decides that child instance A needs to be put in pblock 2 at 48. Child instance A has been previously assigned to pblock 1 by operation of PTree when instance AP was dragged into pblock 1. The designer implements this change by selecting instance A in the left pane and dragging it to pblock 2 shown 48, the dragging being represented by arrow 50. This alters the displays of pblocks 2 and 1 by causing a rectangle or other icon 52 to be displayed in pblock 2 to show that instance A has been added to pblock 2 by adding a pointer for the entry in instance A in the table to pblock 2. PTree then finds the entry for the parent AP of A (instance 12) and sets it to 0 meaning its pointer is destroyed and AP no longer exists in the physical hierarchy. AP's children B and C remain in pblock 1 by their pointers in the array, and child A is in pblock 2.

This would be true for all parents, grandparents etc. (ancestors) in the chain of the child instance in the logical hierarchy above the child instance that was moved if there were other ancestors. Suppose, the logical hierarchy was a six level hierarchy and initially AP was dragged to pblock 1 and AP had children and grandchildren and great grandchildren etc. that extend down to level six. Initially, all the children, grandchildren, etc. down to level six in the logical hierarchy would all be "moved" to pblock 1. This means that all the children, grandchildren, etc. in the chain would be marked in the array as being assigned to pblock 1. Then, suppose a circuit instance GGC in this chain on level six of the logical hierarchy were to be moved from pblock 1 to pblock 2 but all the other children, grandchildren, etc. were left in pblock 1. This move of instance GGC to a pblock other than pblock 1 would cause PTree to recurse from level six of the logical hierarchy all the way up to instance AP and remove all the parents and ancestors from the physical hierarchy. What this means is that the pointers for all these ancestors would be set to 0.

The reason AP's entry in the array disappears (as would the pointers for all other ancestors of the moved instance in other examples) is that AP is comprised of children A, B and C so when all the children are in one place, it is shorthand to just have an entry for AP with a pointer to the pblock to which it is has been assigned. However, when the children of AP are split up into different pblocks, then the shorthand makes no sense and the entry for AP must be eliminated in favor of individual entries for the component circuits that make up AP.

The slash marks through the rectangle 44 representing instance AP and A in pblock 1 represent the moving of child instance A to pblock 2 and the resulting destruction of its parent entry for AP.

This ability to reallocate any circuit in the logical netlist without regard to the logical netlist structure to any physical block in the physical hierarchy allows a designer the flexibility to move circuits around the physical layout as much as is necessary to optimize performance and give the designer much more control over the output of the place and route tool.

Figure 11:
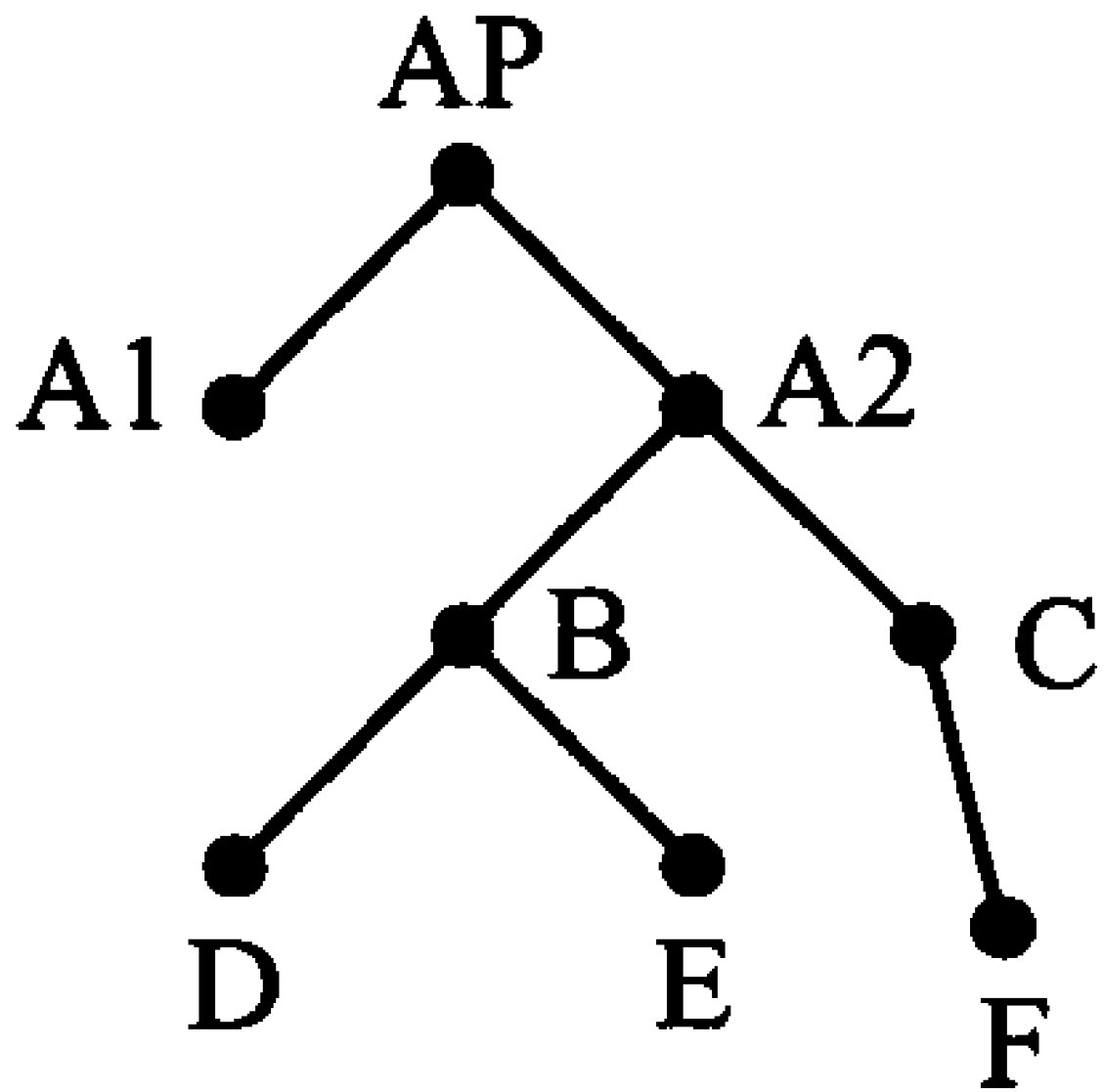
FIG. 11 is an example physical hierarchy to illustrate the operation of certain steps of the PTree Update process.

Block 38 in FIG. 4 represents step 3 in the PTree update process. In this process, recursion up the logical netlist hierarchy to parent instances of instToAppend until a "rooted parent" is found and then processing defined below is performed. FIG. 11 is an example physical hierarchy which will be used to illustrate the process of step 38. Suppose A2 was previously dragged to pblock 1. This cause component instances B, C and their component instances D, E and F to be assigned to pblock 1 initially also so the data object of pblock 1 is updated to include pointers to instances A2, B, C, D, E and F in the logical hierarchy. Now suppose D is dragged to pblock 2. The data object of pblock 1 is modified to remove the pointer to D and the data object of pblock 2 is modified to add a pointer to D. D becomes instToAppend and its rooted parent is A2. The first process of step 38 is to find the rooted parent of D which is A2 and the pblock to which the rooted parent is assigned (which we call the rooted pblock). A "rooted parent" is an instance or circuit which has a flag set in the data object representing said instance in said physical hierarchy which indicates said instance is "rooted" in that it has been assigned to a pblock. The particular pblock to which the instance is assigned is indicated by a pointer in a data object representing a pblock in said physical hierarchy, said identifier or pointer pointing to said instance in the logical hierarchy (so the pblock data object does not have to repeat all the data in the cellview which defines the functionality of the instance and its pins). The flag is set either: 1) when said rooted parent instance is dragged to a pblock by the designer; or 2) after the rooted parent was inherently marked as belonging to the same pblock as its parent (AP in FIG. 11) when its parent (AP) was dragged to a pblock and then its parent (AP) was set to zero in the m_instanceAssignments array. This causes the flag on said rooted parent data object to be set in the "rooted" state (because not all the children of the parent or the rooted parent are still in the same pblock).

Step 38 then marks all the ancestors of instToAppend to zero in the array to make them disappear. The way this is done is the recursion unwinds from the rooted parent down to instToAppend, and the pointers in the array of each ancestor of instToAppend are marked as zero as is the rooted parent. This causes the rooted parent and all the ancestors of instToAppend in the line of descendants in the physical hierarchy between the rooted parent and the instTo Append to "disappear" from the physical hierarchy. An "ancestor" is any instance on a line of descendants between the rooted parent and the instToAppend but not including (for purposes of the claims) either the rooted parent nor the instToAppend. Disappear means their data objects no longer indicate in physical hierarchy data structures that they are assigned to a particular pblock. Why is this done? When not all the children or component instances of a parent instance are assigned to the same plbock, then it incorrect to have the parent assigned to any pblock. A parent can appear in the physical hierarchy as assigned to a pblock only when all its children or component instances are assigned to the same pblock. In other words, the processing of step 38 is performed to find all ancestors (B) of instToAppend D up to but not including the rooted parent (A), and set the pointers for these ancestors (B) in the array m_instanceAssignments to zero so that the rooted parent and all ancestors of instToAppend disappear.

Block 38 in FIG. 4 also represents the PTree process of finding all siblings (only C) of ancestors (B) of instToAppend (D) and marking them as being contained in "rootedPBlock" (pblock 1). This is done by setting the flag in the data object of the sibling to the "rooted" state and making sure the data object for rooted pblock contains a pointer to the sibling (only C in the example of FIG. 11) of the ancestor instance. This guarantees that no primitive instance is left behind.

Block 40 in FIG. 4 is the process the check to determine if all the siblings of instToAppend are marked in the array as belonging to the same pblock as instToAppend. If so, a "collapse operation" is carried out whereby the parent is resurrected and marked as being assigned (and rooted) within the pblock to which instToAppend has been assigned. What this means if that if all the component instances of a parent are marked in the array as belonging to the same pblock, then the parent entry can be resurrected and marked as being assigned to that pblock and the children component entries can have their pblock pointers set to 0 since the parent is marked as assigned to the same pblock. The parent instance is shorthand for all its component instances so when all the component instances of a parent are in the same pblock, then the parent instance is in the pblock and there is no need to have multiple data entries when only one is needed.

This process of step 40 is called defragmentation or collapse. In the example of FIG. 5, if the PTree process finds that B and C have been moved to pblock 2 and are marked as belonging to pblock 2, which is the same pblock as child A has been marked as belonging to, then a resurrection is performed. This resurrection resurrects the entry for AP in the array and marks it as belonging to pblock 2. The entries for children A, B and C can then be marked to 0 because the pointer linking AP to pblock 2 means it components or children A, B and C are all assigned to pblock 2. After this resurrection operation, a recursion up the tree is performed to repeat the process (e.g., determine if all siblings of the resurrected parent are marked as belonging to the same pblock, and resurrecting the grandparent entry and marking it as belonging to the same pblock as the resurrected parent). Another example is shown in FIG. 5. Suppose a sibling of AP called instance DP (shwon at 10 in FIG. 1) has been dragged to pblock 3 shown at 52, the dragging operation represented by line 56. This causes its children components D, E and F to be marked as belonging to pblock 3. Now the designer drags child instance E to pblock 4 shown at 58, as represented by line 60. This causes the parent entry to be marked in the table as 0 since its components have been split between two different pblocks, as represented by the slash through rectangle 62 on the right side of FIG. 5. Later, the designer changes his mind and drags instance E back into pblock 3 so as to reunite it with its only siblings D and F. This causes the entry in the array linking child E to pblock 4 to be set to 0 and it causes the parent entry DP to be resurrected and linked in the array to pblock 3, as represented by rectangle 64.

This defragmentation process is continued until it is no longer possible. This "defragmentation" or "optimization" rebuilds the logical hierarchy (the original logical hierarchy is never altered or destroyed by the tool so that it can serve as a reference) by rejuvenating logical hierarchy instances whenever it makes sense to do so.

At the end of the PTree Update call, the array m_instanceAssignments will accurately reflect the pblock to which every logical primitive in the logical hierarchy belongs. Any hierarchical logical instances that are fully contained by a pblock will also be represented. All remaining hierarchical logical instances which have been effectively "broken up" by distribution of its children or component instances to different pblocks and are not considered part of the physical hierarchy and their entries in the array will have either been set to 0 or removed in some embodiments. The preferred embodiment sets a value of 0 in their m_instanceAssignments array entry.

During the PTree Update process, all changes to the array m_instanceAssignments are captured and recorded in a computer object (in the object oriented computer programming sense an object is a collection of functions with an API and a datastructure) called a "Physical Transaction Object". The Physical Transaction Object has a function call to allow it to be queried to determine which instance have changed the pblocks to which they have been assigned as a result of the PTree Update processing represented by block 38 in FIG. 4. The Physical Transaction Object provides input to the PNetwork Update process to be described next.

PNetwork Update Process

It is critical to maintain the same connectivity defined by the logical hierarchy after instances from the logical hierarchy are moved to the various pblocks. This is the job of the PNetwork Update process.

One rule that nets follow in a hierarchical database is that they never "cross" hierarchical boundaries. Nets may only connect the pins of instances defined within a single cellview. A cellview is the internals of an instance and can be thought of as the definition of what circuitry is in the pblock or a container which contains the instances assigned to the pblock. If an instance such as AP in the example given above has component circuits, one cannot know what those components are until the cellview of AP is selected. A primitive (which by definition has no components) has an empty cellview, but an instance like AP with three components A, B and C will have a cellview which shows the definition of the instance and the components A, B and C and the pins which are the inputs and outputs of component circuits A, B and C and the nets that connect each of these pins to some other pins in the cellview or a pin on the pblock boundary. Two primitives contained by two different hierarchical parents in the physical hierarchy (primitives assigned to different pblocks) may have their pins connected by a set of nets, with one net for every pblock boundary crossed. What this means is that a net that goes from a pin in one pblock to one or more pins in another pblock will have to be broken up into two nets, one going from a pin in the first pblock to a pin on the pblock boundary and the other net going from the pin on the pblock boundary to the one or more pins in the other pblock. This why one can feed the physical hierarchy into the place and route tool one pblock at a time (each pblock is a self contained circuit essentially). In other words, a continuous connection from a parent level hierarchy to an immediate child level can be achieved by defining two nets, one in each level, and each net connects to a given pin defined at the pblock boundary between the "parent instance" and the "child cellview".

The logical hierarchy is defined by the user's input netlist. The process of the invention keeps the logical hierarchy constant (does not change the functionality), yet allows for a completely different, alternate physical hierarchy to be defined (different pblocks with different instances assigned to each) using the circuit instances defined in the logical hierarchy netlist. To accomplish this, it is necessary to pay attention to what nets effectively cross into the new layers of physical hierarchy as they are introduced in steps 2 and 3 above. In other words, when instances that are connected are dragged and dropped into different pblocks, the PNetwork update process learns the nets connecting the instances so assigned to different pblocks and redoes the nets connecting the instances so that two sets of nets are defined for each original net, one net going from one pblock's pins to newly created pins on the pblock boundary and the other net going from a pin on the pblock boundary to one or more pins in the other pblock. Two primitives defined in a common parent logical cellview may be connected by a single net. It is only nets that cross pblock boundaries that have to be broken up into two new nets. In other words, if one of those instances is assigned to a different pblock, the physical hierarchy has been altered by the introduction of the pblock boundary between the two instances that are connected but which have been assigned to different pblocks. in the context of the floorplan's physical hierarchy, a single net cannot simply connect these two primitives together anymore, since one instance now resides in the new pblock and the other instance resides in the former pblock. To maintain database consistency and the proper connectivity, we must define a new pin on the pblock boundary and define two new nets—each will connect one of the primitives to this new pin on the pblock boundary. After inserting a new layer of physical hierarchy by adding a new pblock and dragging instances to it, this PNetwork update process will maintain both database integrity and functional equivalency of the physical hierarchy to the circuitry defined in the logical hierarchy of the netlist. These two newly defined physical nets effectively take the place of the single, original logical net defined in the netlist.

As was the case for the PTree Update operation, the PNetwork update process is defined by the following algorithm, which is shown in flowchart form in FIG. 6, to automate this otherwise burdensome task of keeping nets up-to-date in the context of an alternate physical hierarchy. The algorithm takes PTree Update process results as to which instances have been moved from one pblock to another are captured in the form of a physical transaction data object which serves to provide input to the PNetwork Update process:

```
for each instance that has been removed from a pblock {
for each pin on the removed instance {
disconnect pin and cleanup physical nets/pins as is appropriate
}
    }
        for each instance that has been added to a pblock {
        for each pin on the added instance {
        connect pin and create physical nets/pins as is appropriate
(this means create new pin and net entries in the data structure for
instances which have been moved to different pblocks so as to
recreate in the data structure a representation of the connectivity
defined in the original logical netlist-- the revised data structure will
represent the same nets defined in the original logical netlist but will
show new nets connecting pins of instances in pblocks to pins on pblock
boundaries for nets that cross pblock boundaries so that the revised data
structure represents the equivalent functionality for each net that crosses a
pblock boundary in terms of two nets, one of the new nets being a net
which couples the same pin in the cellview to which the original net was
coupled to a newly defined pin on the pblock boundary, and the other new
net being a net which couples the same newly defined pin on the pblock
boundary to the other pin or pins in the cellview of the instance which
has been moved to a different pblock)
}
}
```

The "disconnect" and "connect" operations listed in steps 1 and 2 above, are symbolized by blocks 66 and 68 of FIG. 6, are each complex algorithms which will be described below each in turn.

Disconnect step 1 basically means set to zero pointers in appropriate pin entries and appropriate net entries in one or more data structures for instances which have been moved to different pblocks. There are data structures which defines which nets are coupled to which pins of which instances in which pblocks and data structures which define which pins are in each pblock by way of pointers to pins defined in the data structures of the original logical netlist. Pointers to the logical netlist or data in these data structures establish the relationships between pblocks, pins and instances and nets coupling pins of instances in a pblock to pins of other instances in the same or different pblocks.

To create a new physical hierarchy, it is necessary to preserve the connectivity defined in the original logical netlist by recreating it in the physical hierarchy being created by the floor planning tool. However, nets cannot cross pblock boundaries as one net, so for each net that crosses a pblock boundary, it is necessary to create two new nets, one of which connects the pin inside a first pblock to a pin on the pblock boundary, and the second of which connects the pin on the pblock boundary to one or more pins in a different pblock. This makes each pblock like a separate stand alone integrated circuit which can be input to the place and route tool and which can easily be stored in its RAM memory without the need to page data in and out from the hard disk.

Disconnect step 1 is the processing which happens when an instance is moved from one pblock to another. When this happens, the data in the data structure which indicates certain nets are coupled to certain pins of an instance that used to be in a first pblock but which has been moved to a second pblock is wrong and it must be corrected. For example, suppose in FIG. 5 child instance A is moved from pblock 1 to pblock 2. Referring to FIG. 9, there is shown an example circuit to illustrate the connect and disconnect operations of PNetwork Update. Suppose that in pblock 42 there is one net 82 which connects instance A (NAND gate 84) to instance B and that instance A has two inputs which are coupled by nets 88 and 90 to instances in some other pblock and which couple two boundary pins 96 and 98 to the inputs of instance A.

Now suppose instance A is moved from pblock 1 to pblock 2 shown at 48. Both pblock 1 and pblock 2 are contained in a root pblock (not shown). Dragging A into pblock 2 would cause net 82 to cross the pblock boundary 92 of pblocks 1, cross the root pblock, represented by the space between pblocks 1 and 2 and enter pblock 2. However, this is not allowed because of the compartmentization of pblocks so that each can stand alone as an input to the place and route tool.

To implement this change, the PTree update process of FIG. 4 will take care of changing the data structure to reflect the move of instance 84 from pblock 1 to pblock 2. This is done by accessing the data object (defined above in the definition of PBlock) and removing the pointer to instance A from the list m_childInstances for pblock 1 (the list defining all circuits in that pblock). Then the data object for pblock 2 is accessed and a pointer to instance A is added to its list m_childInstances.

Figure 7:
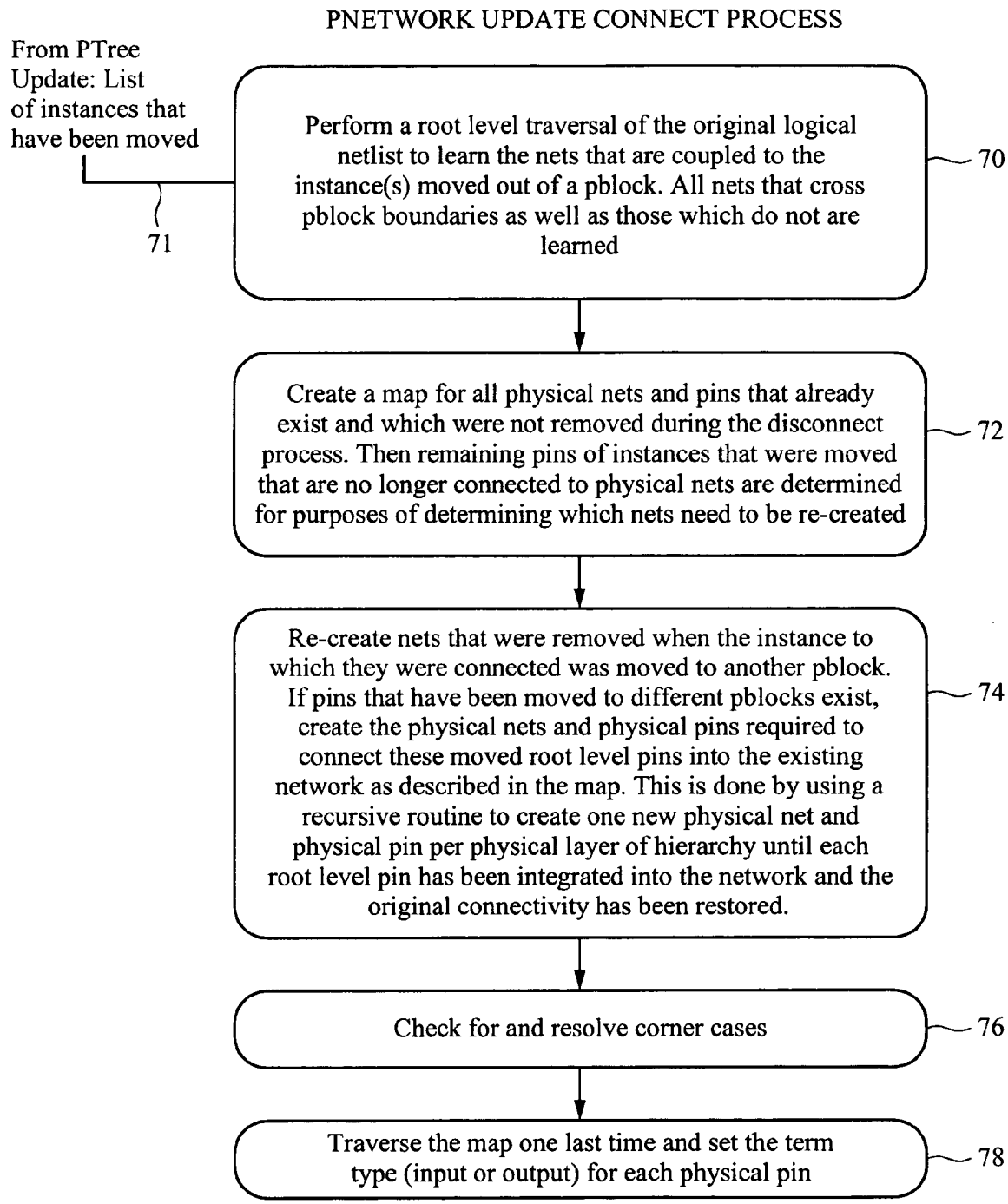
FIG. 7 is a flowchart of the connect process of PNetwork Update.
Figure 8:
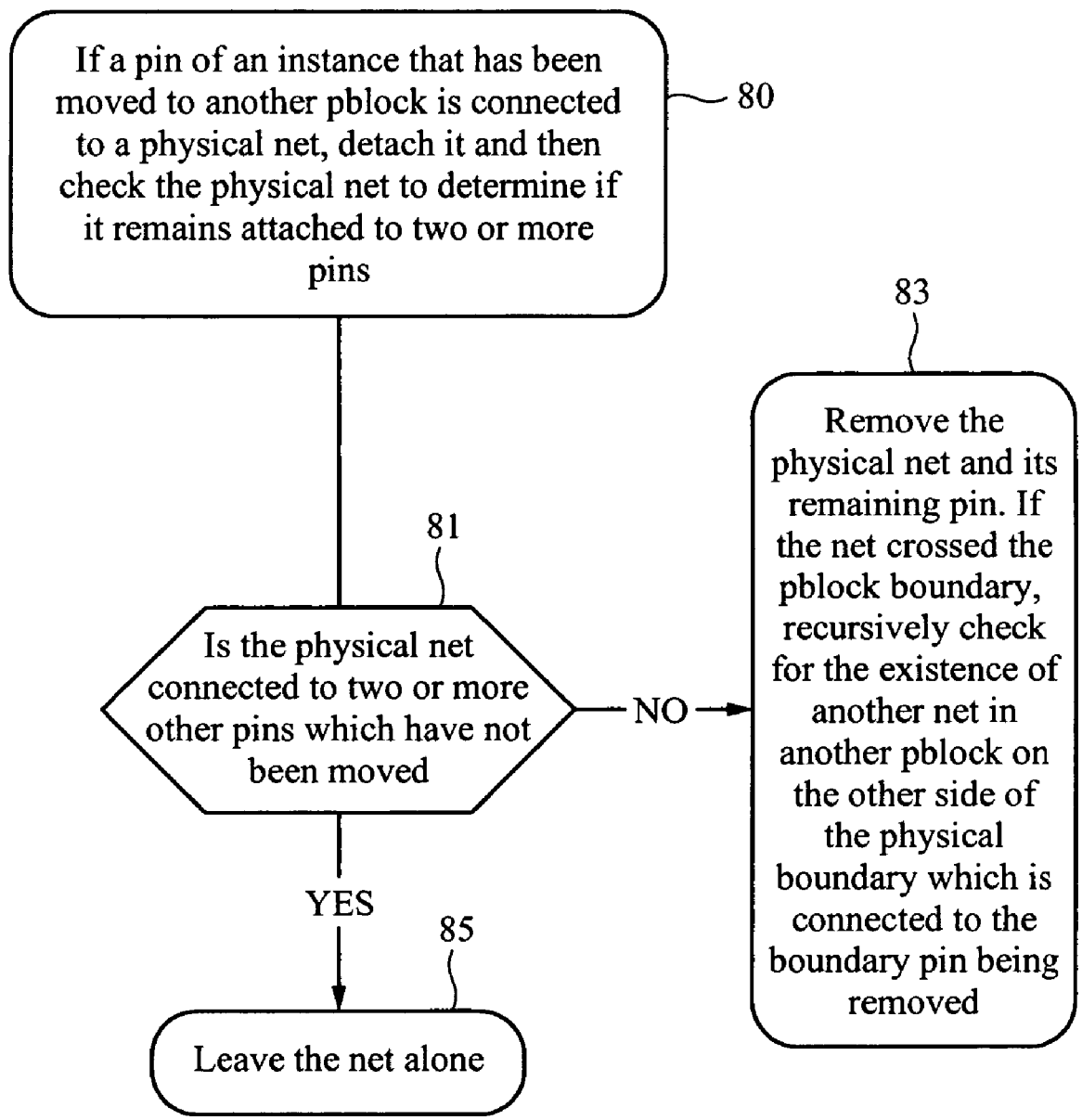
FIG. 8 is a flowchart of the disconnect process of PNetwork Update.

It is the job of PNetwork update to change the data in the data structures that define the physical hierarchy to reflect the changes in the nets so that the nets still define the same functionality but reflect connections to A in pblock 2. To do this, the disconnect process represented by FIG. 8 is performed first, then the connect process represented by FIG. 7 is executed.

The Disconnect Process

Figure 10:
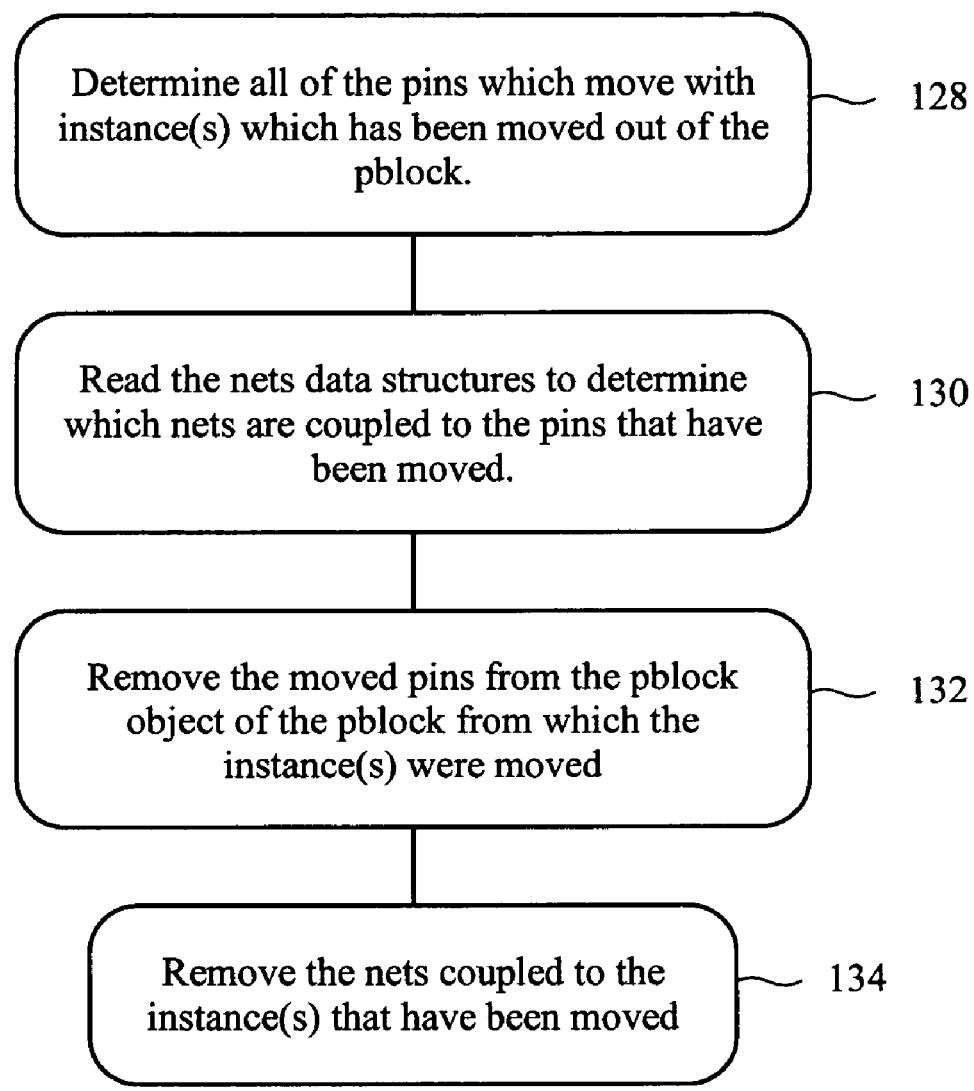
FIG. 10 is a flowchart of an alternative embodiment of the PNetwork disconnect process which does not try to save any portion of nets connected to instances which have been moved.

The disconnect process can be accomplished in alternative embodiments which are based on the premise that if a net is connected to a pin which has been removed from a pblock, the entire net is removed and rebuilt in the correct location by the connect process with no analysis of whether portions of the net did not have to be removed. This is done effectively by eliminating steps 81, 83 and 85 from FIG. 8 and changing step 80 to perform the following process, which is illustrated in the flowchart of FIG. 10:

1) When an instance has been moved from one pblock to another, determine which pins which move with it (step 128—this is accomplished by determining the instances which PTree update has moved from one pblock to another and then reading the cellviews of the data structures for those instances to determine which pins are owned by those instances);

2) In an alternative embodiment, read the nets data structures to determine which nets are connected to the moved pins (step 130—each net data structure or object includes a list of the pins to which it is connected). In the preferred version of this alternative embodiment, read the pin data structure for each moved pin and follow a pointer to the net or nets connected to each pin.

3) Remove the moved pins from the data structure of the pblock from which the instance has been removed (step 132—this is done by accessing the data object of the pblock from which the instance was removed and accessing the cellview of the instance that was removed to determine which pins are on that instance and removing those pins from the pblock object's list of pins); and 4) Remove the moved nets. This is done by accessing the data structures of the nets which are connected to the moved pins and the removing all the moved pins and all the other pins to which these nets are connected from the net's data object for each net coupled to an instance that has been moved out of the pblock. This is done even though the other pins were not moved thereby effectively removing the nets connected to the moved instance(s) from the pblock from which the instance was moved.

However, in the preferred embodiment of the disconnect process, analysis is done to determine if portions of a net that couple pins of instances that have not been removed from a pblock can be left in place so that these nets do not have to be rebuilt by the connect process. The first step in the preferred embodiment of the disconnect process is represented by block 80 in FIG. 8. In this step, the floor planning tool determines if a pin of an instance that has been moved to another pblock is connected to a physical net. This is done for all pins of all instances that have been moved. Disconnecting nets from pins is done simply by changing the pointer data in the data structure of the pblock so that the pin to which the net is connected is no longer listed as part of the pins in a pblock. The pin is then also removed from the data object of the net which also contains a list of pins (implemented as pointers to the pins on the instance data objects in the logical netlist to which the pins belong) to which the net is connected.

As an example of how step 80 works, consider output pin 94 and the input pins 108 and 110 of instance A. Step 80 is carried out as to output pin 94 by changing the data in the data structure of pblock 1 to remove pins 94, 108, 110, 96 and 98 from the list of pins in the pblock 1 data object to disconnect net 82 from pin 94 and disconnect nets 88 and 90 from the input pins and boundary pins.

The process of step 80 removes the pins that have been moved from the pblock but leaves nets 82, 88 and 90 still in pblock 1 where they no longer belong and not in pblock 2 where they do belong. The rest of the disconnect process is a clean up process to change data in the data structures indicating nets 82, 88 and 90 are in pblock 1 so that the data objects no longer indicates these nets are in pblock 1.

Each net has a data structure which includes the list of pins to which the net is connected. Each instance has a data structure which includes a cellview which defines the functionality of the cell and which pins are part of that cell. Each pblock has a data structure which has, among other things, a list of pins for instances assigned to that pblock.

The second step in the analysis process of the preferred embodiment of the disconnect process is represented by step 81 in FIG. 8. This represents the process of analyzing the data objects in the original logical netlist to determine if the net which has just been disconnected from a pin of an instance which has been removed is connected to two or more other pins which have not been moved from the pblock to which they were originally assigned with the instance of which they are a part.

If not, step 83 is performed to remove the physical net and its remaining pin. This is done by removing the remaining pin from the list of pins in the data structure of the pblock from which the instance has been removed. Sometimes, the other pin to which the net was connected will be a boundary pin. If this is the case, there will be a net in another pblock which connects to a boundary pin of the other pblock and a net in the root pblock which connects the two boundary pins. Step 83 also recursively checks for the existence of another net on the other side of the pblock physical boundary, and removes the other net and its boundary pin and the net on the root pblock if it finds another net in cases where the net being removed from a pblock crossed the pblock boundary.

If test 81 determines that the physical net that has been disconnected from a pin of an instance that has been removed is connected to two or more other pins which have not been moved, step 85 is performed to leave the net alone. This is done in the preferred embodiment because a portion of the net is still useful and is not changed in the physical hierarchy so there is no point in removing the net and then just having to rebuild the parts which did not change in the connect process. The connect process will later generate new nets which connect the pin that was moved to the original net so as to re-construct the original connectivity defined in the logical netlist. Steps 81 and 85 are accomplished by reading the original logical netlist to determine to which other pins the net disconnected from a removed pin in step 80 is connected and in what pblocks those other pins are and whether those pins have moved. If the net is coupled to two or more other pins which have not moved, the net can be left alone even though it will have a segment which is "floating" because it has been removed from a pin which has moved to a new pblock.

In the example of FIG. 9, step 81 will determine that net 82 is connected to pin 106 at the input of B and pin 110 at the input of C. Therefore, step 85 will be performed, and net 82 and segment 112 will not be removed. If segment 112 did not exist, then step 81 would vector processing to step 83 which would remove net 82 altogether from pblock 1. This would be done by removing pin 106 from the list of pins in the data structure of pblock 1 and then removing pins 94 and 106 from the data object of net 82.

The Connect Process

It is the job of the connect process, represented by block 68 in FIG. 6 to recreate the original net functionality by reconnecting nets (newly created if necessary) to the appropriate pin(s) of the instances moved. In the example of FIG. 9, the connect process will recreate the connection of net 82 between the output pin 94 of A and the input pin 106 of instance B. This is done by creating a new boundary pin 100 on the pblock boundary 92 and another boundary pin 114 on the boundary 116 of pblock 2. Then, three new nets 102, 104 and 118 will be created. New net 102 connects new boundary pin 100 to input pin 106 of instance B. New net 104 connects output pin 94 of instance A in pblock 2 to boundary pin 114 of pblock 2. New net 118 in the root pblock (pblocks can be nested and the root pblock contains pblocks 1 and 2) connects new boundary pins 100 and 114. To recreate the functionality of nets 88 and 90, two new boundary pins 120 and 122 are created and two new nets 124 and 126 are created connecting pins 120 and 122, respectively to input pins 108 and 110 of A. Other processing will create new nets that connect whatever was originally connected to boundary pins 96 and 98 to new boundary pins 120 and 122.

The Connect Algorithm

We turn to a more general summary of the connect algorithm:

Learn the Nets: Perform a "root-level traversal" of the original logical netlist to learn the nets connected to each pin of each instance that has been moved. This is done by reading each cellview of the instances that have been moved out of a pblock to learn which pins are part of the moved instance(s) reading the data objects of all nets defined by the original logical netlist to determine which nets are coupled to the moved pins and which other pins of which other instances to which each net is coupled. This procedure, represented by block 70 in FIG. 7, explores the various logical nets that comprise the network used to connect to the instances in the logical netlist that have been moved. Step 70 receives data from a transaction object which is written by the PTree Update process and which contains a list of all the instances which have been moved from one pblock into another. This input data from PTree Update is represented by line 71 in FIG. 7. Step 70 determines from this input data all the instances which have been moved and then determines all pins that are owned by the cellviews of the moved instances. Pins contained directly by a pblock (pins of an instance assigned to a pblock) are referred to as "root-level pins". Step 70 then uses this list of pins of instances that have been moved to access the net (wire or data path) data objects or other data linking individual nets (wires) to individual pins so as to determine which nets are coupled to the pins of the instances which have been moved. This yields a list of nets affected by the move or moves of one or more instances. The data objects of each net on this list is then read to determine which other pins to which each net is coupled. Step 70 also represents the process of determining the disconnected or "floating nets", I.e., nets which were formerly coupled to the pins of the instances which have been moved but which have been disconnected from pins on the moved instances by the disconnect process described above. This is done because the disconnected nets need to be reconstructed. Step 70 also determines which of the pins to which the affected nets are still connected are still in the same pblock they were before the moved instance(s) were moved. This is inferred because if a pin is listed in a net's data object after the disconnect process, the net is still connected to the pin and the pin has not moved from the pblock is was formerly in. The pblock each pin is in can be determined by determining the instance each pin belongs to and reading the pblock data objects to determine which instances are in each pblock.

It is necessary to determine which nets would cross one or more pblock boundaries after an instance is moved because those nets will have been disconnected by the disconnect process and must be reconstructed. Pins connected to nets which cross pblock boundaries are the starting points for new physical nets to be created. These new nets define a conductive path which crosses pblock boundaries by creating several new nets, one in each pblock and coupling one or more pins in the pblock to one or more newly defined pins on the pblock boundaries. New nets in the root pblock that connect the boundary pins complete the conductive path. Basically, the process of step 70 learns:

a. the nets coupling each pin of a cellview to other pins in the same cellview;
b. the nets coupling pins of all cellviews in the same pblock to other cellviews in the same pblock; and
c. nets coupling the pins of the instance in a pblock to other instances in other pblocks.

Create the Map:

Given the root-level pins, create a "map" for any physical nets and pins that already exist so as to create a map of the portions of the network defined by the logical hierarchy which still exist. This map is created by taking the list of nets obtained in step 1 which were formerly connected to pins of the instance(s) which have been moved and accessing the data objects for those nets and determining to which pins the nets are still connected. From that group of pins, the instances the nets are still connected to can be determined, and from that list of instances, the pblocks in which each net resides can be determined from accessing the pblock data objects. Once all the pins that are still connected to the affected nets obtained in step 1 are determined, there will be pins left over from the list of pins obtained in step 1 because the affected nets were disconnected by the disconnect process from pins of instances that were moved. It is these nets that need to be reconstructed by the next step, so the map process saves these pins.

This mapping process of the preferred embodiment is represented by block 72 in FIG. 7 and creates a map of the nets which do not have to be destroyed and develops data indicating to which pins the affected nets must be reconnected because of the operation of the disconnect process. The original logical netlist can be used to create this map because it contains data objects which defines segments which are connected to pins which have not moved as well as data which defines the net segments that were destroyed by the disconnect process and which will have to be re-created. In the example of FIG. 9, net 82 includes a segment 112 which does not have to be removed so the preferred embodiment of the disconnect process retains segment 112 and the data object for net 82 indicates it is still connected to pins 106 and 110.

In other words, the preferred embodiment assumes that when an affected net connects more than twp pins, part of the net will survive a "disconnect" operation, so that at least that part does not have to be re-created.

Re-Create Nets that Have Been Destroyed:

Where part of a net is destroyed, one or more new nets are created which connect a moved pin into this network rather than recreating it from scratch. This is done by checking the map data of each affected net which had a segment destroyed by the disconnect process to determine to which pins of moved instances a net segment was formerly connected. If such pins exist, step 3 will create the physical nets and physical pins required to re-connect the pin of the instance which has been moved to another pblock into the existing network as described in the map so as to re-create the original connectivity defined in the logical netlist.

Here a recursive routine creates one new physical net and physical boundary pin per physical layer of hierarchy until the root-level pin of the instance which has been moved to a different pblock has been integrated into the network with the same connectivity as defined in the original logical netlist. In the example of FIG. 9, pins 94, 108 and 110 have moved to pblock 2 from pblock 1. Step 3 will read the map and the leftover pin information for nets that have been disconnected and determine that a connection between pin 94 and pin 106 must be re-created. This step will also determine that nets 88 and 90 must be re-created. Step 3 will then create new boundary pin 100 in pblock 1 by adding a new pin representing pin 100 to the list of pins in the data object for pblock 1. Step 3 then creates new boundary pins 114, 120 and 122 in pblock 2 by adding these new pins to the data object for pblock 2. It will then create new nets 104, 124 and 126 in pblock 2 by creating new data objects for each of these nets and adding pins 94 and 114 to the list of pins to which net 104 is connected, and by adding pins 108 and 120 to the list of pins to which net 124 is connected. Likewise for the data object for net 126 (pins 110 and 122 are added to its list). That completes the reconnection process for the example of FIG. 9.

Check for Corner Cases:

There are some corner-case conditions we check for and take care of, as represented by block 76.

Set Input or Output Type for Each Pin in the Physical Hierarchy:

Traverse the map one last time and set the "term type" (eg, input, output) for each physical pin in the network, as represented by block 78.

The PTree Update and PNetwork Update processes explain how the user can create many pblocks and drag and drop multiple instances into each pblock while the software processes of the tool dynamically update the physical hierarchy on the fly to maintain the connectivity and make sure no instances from the logical hierarchy of the netlist have been left out of the physical hierarchy. The processes described herein can be performed by the user "until the user is satisfied with the floorplan"—the tool contains many other interactive analysis features (timing estimates, utilization, DRC checks, etc) that help provide feedback to the user to allow the user to determine when he or she is satisfied with a floorplan.

When the user is satisfied with the floorplan, he can export the floorplan information so that it can be used as input "guiding directives" to the place and route software. Because the floor planning tool of the invention maintains the original logical hierarchy of the netlist in an unaltered state, in addition to maintaining a dynamic, incremental and complete physical hierarchy, the user has the option of exporting his design to the place and route tool in either logical or physical terms. Exporting the design in physical terms is especially useful when the user wishes to break up his design in chunks or blocks, and send the blocks one at a time through the place and route software—a divide and conquer approach. It is especially convenient that the user can export the netlist corresponding to a particular pblock—a physical netlist for this block can easily be generated based on the physical hierarchy we've maintained for the user.

Figure 12:
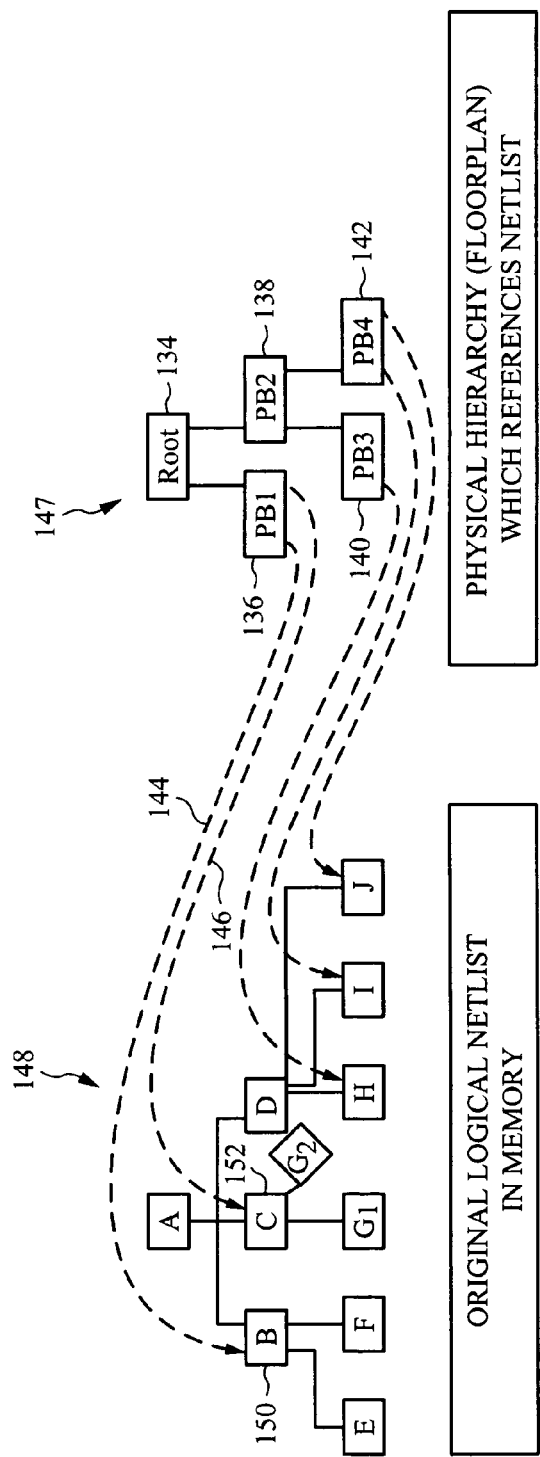
FIG. 12 is a diagram illustrating how a physical hierarchy (floorplan) saves memory space by referencing the circuits or instances which are in each pblock by using pointers to the circuits in the original logical hierarchy defined by the netlist.

FIG. 12 is a diagram illustrating how a physical hierarchy (floorplan) 147 saves memory space by referencing the circuits or instances which are in each pblock by using pointers to the circuits in the original logical hierarchy 148 defined by the netlist. In the floorplan illustrated root pblock 134 (the entire chip surface) contains within its boundaries child pblocks pb1 136 and pb2 138. Pb2 itself contains child pblocks pb3 140 and pb4 142 within its boundaries. Pointers 144 and 146 represent data in the pb1 data object which point to instances B and C shown at 150 and 152 in the logical hierarchy. Likewise, pointers in the data structure of pb4 point to instances I and J as assigned to pb4 and another pointer in pb3's data structure points to instance H as included therein. This pointer notion in the preferred embodiment saves memory space in storing the data objects which define the physical hierarchy 147 because all the data needed in the data objects that define the logical hierarchy 148 need not be repeated in the physical hierarchy and can just be pointed to using pointers. However, in alternative embodiments, the entire data of an instance can be stored in a pblock's data structure when an instance is dragged into a pblock. In other alternative embodiments, instances may be assigned to pblocks by command line text commands or through any other means. In the claims, dragging or dragging and dropping or assignment operations should be interpreted to mean any way the user indicates which instances are supposed to be in which pblocks.

Figure 13:
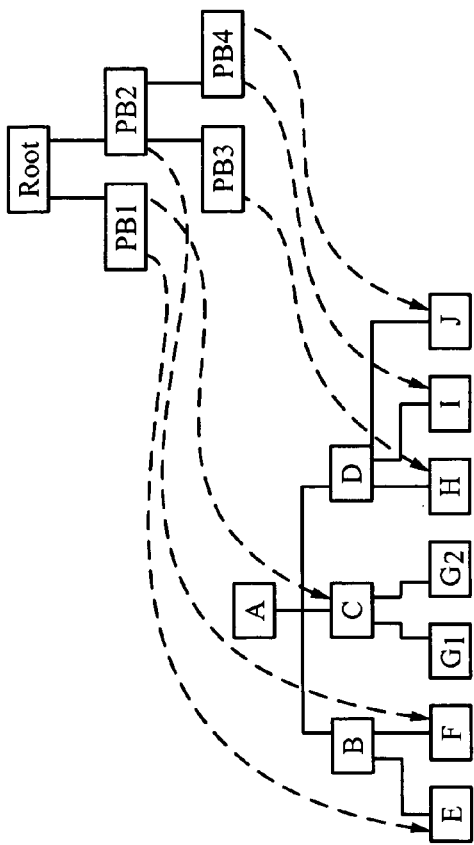
FIG. 13 illustrates how the pointer data in the physical hierarchy is changed by the PTree update process when F is dragged from pb1 (where it was assigned when its parent B was dragged to pb1) to pb2.

To illustrate the operation of PTree Update graphically, refer to FIG. 13. FIG. 13 illustrates how the pointer data in the physical hierarchy is changed by the PTree update process when F is dragged from pb1 (where it was assigned when its parent B was dragged to pb1) to pb2. A new pointer in the data object of pb2 is added which points to F and a new pointer in the data object of pb1 is added which points to child instance E and the pointer in pb1 that points to parent B disappears because this pointer was set to zero when the children of B were split between two different pblocks.

Figure 14:
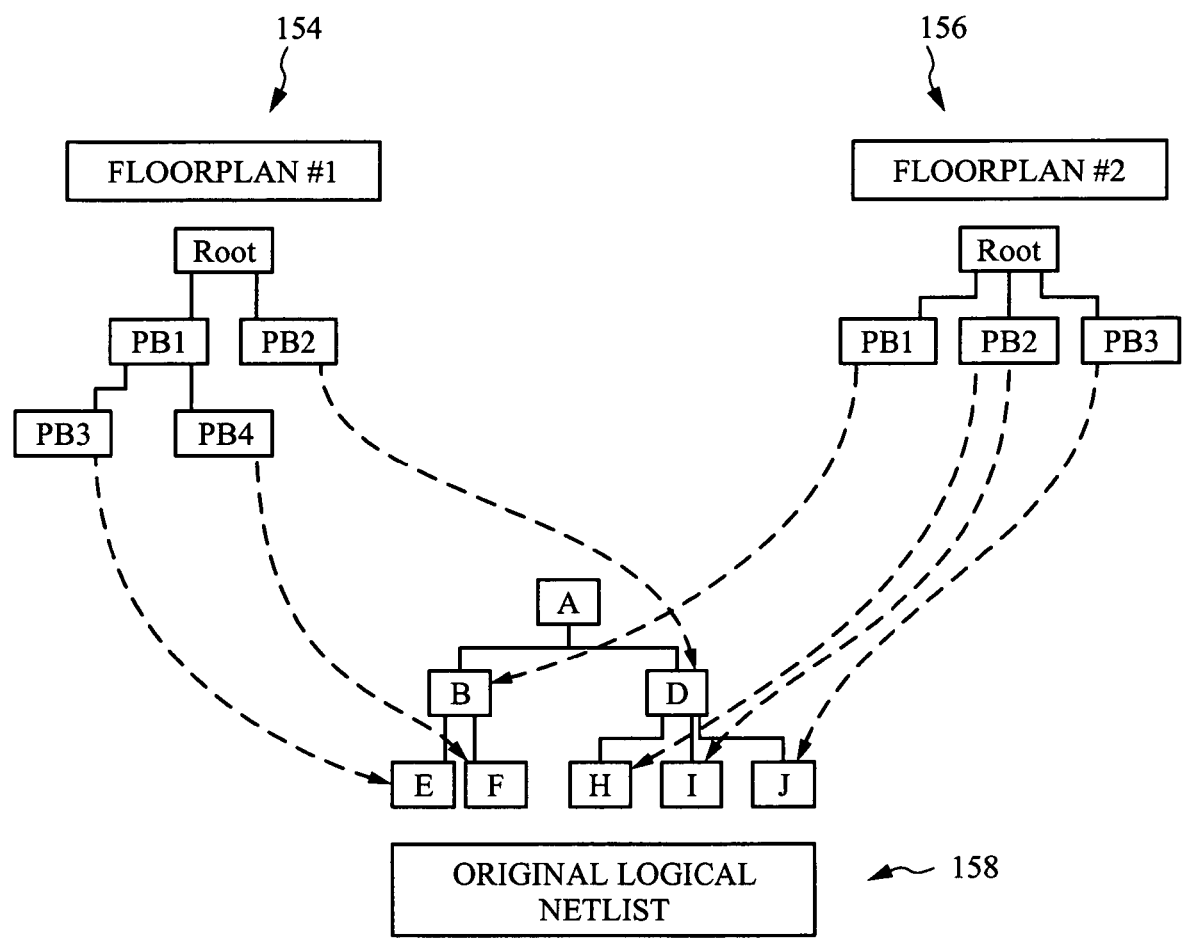
FIG. 14 illustrates how two different alternative floorplans can be developed for a chip using pointers to the same logical hierarchy instances.

FIG. 14 illustrates how two or more different alternative floorplans can be developed for a chip using pointers to the same logical hierarchy instances. In the example of FIG. 14, physical hierarchy #1 (floorplan 1), shown at 154, has a different physical hierarchy than physical hierarchy #2 (floorplan 2), shown at 156. Each physical hierarchy is comprised of data structures for the pblocks which contain pointers to the instances in the logical hierarchy 158. Each set of pointers is different but the data that define the functionality and pins of the instances in the netlist 158 does not have to be copied into the data objects of the floorplans and is only referenced by pointer data. This allows a number of alternative floorplans to be created on the same workstation without exceeding the machine's random access memory capacity and slowing down the operation of the machine by requiring paging of data between RAM and the hard disk.

FIG. 15 is a flowchart of the processing that happens to disconnect and reconnect an entire pblock when the pblock has been moved from one parent pblock to another parent pblock. Step 160 represents the process of running the disconnect process described earlier on the pblock being moved so as to disconnect all the pins of the pblock before the pblock is actually moved. This is accomplished by accessing the data object of the pblock and reading the list of pins in the data object. The net data objects are then searched using this list of pins to determine which nets are coupled to these pins. When a net data object is found which is coupled to a pin on the list of pins of the pblock being moved, the net is disconnected from the pin by removing the pointer to the pin from the list of pin pointers in the net's data object.

Step 162 represents the process of moving the pblock from one parent to another and altering the data in the data structure to show the new parent and position in the physical hierarchy of the instance that was moved. This is done by dragging and dropping the pblock into the new parent pblock in terms of the preferred user interface, but any other way of assigning the pblock as a child of another pblock such as by text based command line can be used in other embodiments. The data in the data structure of the physical hierarchy is also altered to reflect the new parentage by accessing the data object for the former parent and removing the reference to the moved pblock from the list of child pblocks included within the parent pblock. Likewise, the data object for the new parent is accessed and the name of the moved pblock is added to the list of child pblocks. The list of child pblocks in all the pblock data structures defines the tree structure of the physical hierarchy.

Step 164 represents the process of reconnecting the boundary pins of the moved pblock to whatever they were connected to before the move by creating as many new boundary pins and nets as needed to do the job. This process is the same as the connect process previously described except that the only pins involved are the boundary pins of the pblock that was moved and no pins or nets inside the pblock that was moved were affected.

Figure 16:
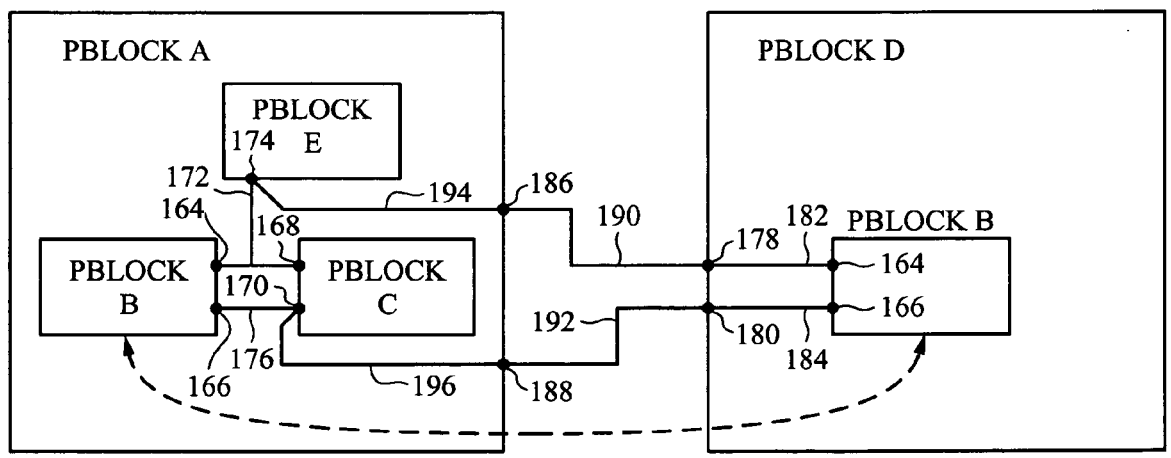
FIG. 16 is a sample physical hierarchy which will be used to explain this process of disconnecting and reconnecting a pblock which is dragged to a new parent.

FIG. 16 is a sample physical hierarchy which will be used to explain this process of disconnecting and reconnecting a pblock which is dragged to a new parent. Suppose two sibling pblocks A and D are in the root pblock (not shown), and pblock A has three child pblocks B, C and E. Suppose also that pblock B has two boundary pins 164 and 166 which are connected to boundary pins 168 and 170, respectively, of pblock C. Suppose also that boundary pin 164 is also connected by a net 172 to a boundary pin 174 of pblock E. Now suppose pblock B is dragged out of pblock A and into pblock D. Before this happens, the disconnect process 160 will determine all the boundary pins of pblock B by reading its data object (boundary pins are flagged or otherwise set apart in some embodiments). Step 160 will then read the data objects of the nets to determine which nets are coupled to boundary pins 164 and 166 and will find nets 172 and 176. The data objects for these nets will be read and it will be determined that net 172 is connected to two other pins, both of which remain in pblock A. Step 160 will add net 172 to the map and not remove it but net 172 will be disconnected from pin 164 by removing the pointer to pin 164 from the data object for net 172. The data object for net 176 will show that it is coupled to only one other pin 170. This net will be disconnected from pins 166 and 170 and those pins will be removed from the data object of net 176 so as to remove the net.

Next, pblock B is placed in pblock D by accessing the data object for pblock A and removing the reference to pblock B from the list of child pblocks and accessing the data object for pblock D and adding a reference to pblock B to the list of child pblocks.

Finally, step 164 is performed by creating new boundary pins and nets as needed to recreate nets 172 and 176. To do this, the connect process creates two new boundary pins 178 and 180 in the data object of pblock D and creates two new nets 182 and 184 to connect boundary pins 164 and 166 of pblock B to new boundary pins 178 and 180. Then two new boundary pins 186 and 188 are created in the data object of pblock A and two new net data objects representing new nets 190 and 192 are created and pins 186 and 178 are added to the data object for net 190 and pins 188 and 180 are added to the data object for net 192. Finally, two new net objects are created for nets 194 and 196 and pins 186 and 174 are added to the data object of net 194, and pins 188 and 170 are added to the data object for net 196.

Each Pblock Stands Alone as a "Chip within a Chip"

With very large netlists, the amount of data needed to describe the logical cells in a integrated circuits with millions of transistors can easily exceed the RAM capacity of the place and route work station. When this happens, it is necessary to store part of the netlist in RAM and page the remainder in and out of memory from the hard disk. This slows down the operations of the place and route tool.

The teachings of the invention contemplate supplying a solution to this problem by constructing the pblocks so that each stands alone and can be input to the place and route tool separately without the rest of the physical hierarchy. This greatly reduces the amount of data that needs to be stored in RAM of the place and route tool so that the RAM capacity is not exceeded. Only the amount of data that defines the pblock and the data from the logical netlist pointed to by pointers in the pblock and other data structures of the physical hierarchy need be stored in the place and route tool memory.

The main enabling technology to build pblocks in this way has already been described. Specifically, pblocks have data structures which contain pointers to the instances assigned to that pblock and a list of pins in the pblock including the boundary pins. When instances are dragged from one pblock to another, nets that will cross the pblock boundary are erased and recreated using boundary pins on each pblock boundary the net crosses. The nets are segmented so that a portion goes from the internal pin to the boundary pin. Other nets connect boundary pins of different pblocks and traverse the root pblock and the final nets connect from boundary pins of the other pblock to the internal pins of the other pblock.

However, power and timing constraints exist that were supplied with the original netlist. Timing constraints are maximum time interval specifications between the time a first thing happens at one end of a net (such as a switch changing states) to the time a second thing happens at the other end of a net with the first thing and second thing being in a cause-effect relationship. In other words, they are means to define how fast different components of the chip need to work in terms of the maximum allowable delay between the time when a signal enters the chip and the time when it leave it. For example, the time it takes for a change in logic level at one end of a net (caused by a switch at one end of a net to changing states) to propagate to the other end of the net and set a flip flop, etc. is a typical timing constraint. Another example of a timing constraint is clock period constraint which defines the speed at which the chip/processor will eventually operate. Typically these constraints are defined on the top level logical netlist.

Delay in propagation of changes in signal level are caused by limited current drive capability, parasitic capacitance along line and input parasitic capacitance of the driven stage.

Power constraints are specifications of the maximum amount of power that can be consumed such as by charging and discharging parasitic capacitances.

When a logical netlist is broken up into pblocks in a physical hierarchy, it is necessary to break up or annotate the pertinent timing and power constraints on a pblock by pblock basis so that each pblock will have its own portion of a timing and power constraint to meet and can be optimized individually. Annotation of the constraints from the logical netlist for each pblock allows this information to be passed to the place and route tool so that the physical placement of instances in the pblock and connections between the instances can be implemented so as to be optimized to meet the timing and power constraints. Once all the physical blocks have been optimized, they can be brought together to generate the final place and route solution.

There are two major steps involved in the process of adapting the constraints to each pblock: constraints pruning; and delay budgeting. Constraints pruning for a pblock involves selecting only those constraints which affect this particular pblock from the set of original constraints. For example, a chip may have multiple clocks and different clock period constraints may have been defined for each clock. A pblock which contains portions of the top level logical netlist may not be affected by all the clocks. Hence for this pblock, only the clock period constraints which affect the pblock are retained and the rest are ignored.

Once a logical netlist has been divided into pblocks, delay budgeting distributes original maximum allowable delay to individual maximum allowable delays per each pblock along the pertinent data path of the chip. Therefore, the time a signal enters a pblock at a boundary pin until the time it leaves the pblock at another boundary pin is limited/bounded by the delay budget assigned to this particular pblock. Delay budgeting ensures that when pblocks are brought together to form the full chip place and route solution, the maximum allowable delay constraint for the whole design is met.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A computer readable medium having stored thereon a data structure defining a physical block (pblock) in a hierarchy of pblocks (both parent and child) which defines the same integrated circuit structure by reference to data in a netlist which defines a logical hierarchy, the data defining said pblock comprising:
    A) a set of pointers to data defining boundary pins of said pblock, said boundary pins for connecting to nets external to the pblock and for connecting to nets internal to the pblock;
    B) a field containing a pointer to a first parent physical block cellview (pcellview) which contains said pblock;
    C) a field containing a pointer to a second pcellview data structure owned by said pblock, said second pcellview containing pointers to data which define lists of pins internal to the pblock, nets that connect to the internal pins and boundary pins of the pblock, child pblocks and child instances which have been assigned to said pblock and which define the functionality of said pblock; and
    D) a field containing coordinates on a floorplan representing a surface of an integrated circuit on which circuits assigned to said pblocks are to be formed, said coordinates to define a geometric shape representing said pblock and the size thereof, said geometric shape being displayed on a computer display of a computer executing a floor planning process.

2. The computer readable medium of claim 1 wherein the data structure further includes data pointers to data which define internal pins of instances contained within said pblock.

3. The computer readable medium of claim 1 wherein said data structure includes a pcellview data structure comprising:
    E) a list containing data which defines a list of pblocks which are included or nested within said pblock defined by data elements A through D;
    F) a list containing data or pointers to data on said netlist which define instances which have been assigned to said pblock;
    G) a list containing data or pointers to data which define boundary pins of said pblock which connect to internal nets of said pcellview;
    H) wherein the list containing pointers to data which define internal physical nets which connect from boundary pins of said pblock to internal pins completes the original connectivity between instances defined in said netlist; and
    I) a field which contains a pointer to a data object representing a parent pblock that envelopes the pcellview data object defined by data elements E through I.

4. A computer readable medium having stored thereon a data structure defining a physical block cellview (pcellview) owned by a particular pblock in a hiearchy of pblocks which defines the internals of said pblock which owns said pcellview, the data defining said pcellview comprising:
    A) a list containing data which defines a list of pblocks which are included or nested within said pblock defined by data elements A through D;
    B) a list containing data or pointers to data on a netlist which define instances which have been assigned to said pblock;
    C) a list containing pointers to data which define boundary pins of said pblock which connect to internal nets of said pcellview and to external nets of said pblock;
    D) a list containing pointers to data which define internal physical nets which connect from boundary pins of said pblock to internal pins of said pblock so as to complete the original connectivity between instances defined in said netlist; and
    E) a field which contains a pointer to a data object representing a parent pblock that envelopes the pcellview data object defined by data elements A through E.

5. A processor-based method for representing a netlist that defines a logical hierarchy, comprising:
    creating in a memory respective representations of a plurality of physical blocks (pblocks), wherein each pblock specifies,
        a set of boundary pins of the pblock, the boundary pins for connecting to nets external to the pblock and for connecting to nets internal to the pblock;
        a reference to a first parent physical block cellview (pcellview) that contains said pblock;
        a reference to a second pcellview owned by the pblock, the second pcellview specifying lists of pins internal to the pblock, nets that connect to the internal pins and boundary pins of the pblock, child pblocks and child instances assigned to said pblock and that define the functionality of the pblock; and
        a set of coordinates representing a surface of an integrated circuit on which each circuit assigned to the pblock is to be formed.

6. The method of claim 5, further comprising:
    displaying instances of the netlist in a first pane on a display and the pblocks in a second pane on the display; and
    highlighting display of instances of the netlist that are assigned to pblocks.

* * * * *